(12) United States Patent
Zhang

(10) Patent No.: US 7,932,494 B2
(45) Date of Patent: Apr. 26, 2011

(54) METHOD FOR CHARACTERIZING VIBRATIONAL PERFORMANCE OF CHARGED PARTICLE BEAM MICROSCOPE SYSTEM AND APPLICATION THEREOF

(75) Inventor: Nan Zhang, Sunnyvale, CA (US)

(73) Assignee: Hermes Microvision, Inc., Hsinchu (TW)

( * ) Notice: Subject to any disclaimer, the term of this patent is extended or adjusted under 35 U.S.C. 154(b) by 270 days.

(21) Appl. No.: 12/397,042

(22) Filed: Mar. 3, 2009

(65) Prior Publication Data
US 2010/0224792 A1   Sep. 9, 2010

(51) Int. Cl.
*G21K 7/00* (2006.01)
(52) U.S. Cl. ............... 250/306; 250/310; 250/442.11
(58) Field of Classification Search .......... 250/306
See application file for complete search history.

(56) References Cited

U.S. PATENT DOCUMENTS

| | | | |
|---|---|---|---|
| 6,992,290 B2 * | 1/2006 | Watanabe et al. | 250/310 |
| 7,271,917 B2 * | 9/2007 | Van Donkelaar et al. | 356/500 |
| 7,352,149 B2 * | 4/2008 | Butler et al. | 318/649 |
| 2009/0182521 A1 * | 7/2009 | Sill et al. | 702/104 |

* cited by examiner

*Primary Examiner* — Phillip A Johnston
(74) *Attorney, Agent, or Firm* — Muncy, Geissler, Olds & Lowe, PLLC

(57) ABSTRACT

A method of characterizing the vibrational performance of a charged particle beam microscope system having at least one encoder is disclosed. The encoder is part of a control system for controlling the speed of a stage whereupon a sample is secured for imaging. A plurality of images each corresponding to a specific encoder working frequency are analyzed to generate imaged pattern vibration amplitude information over an imaging time period. The generated imaged pattern vibration amplitude information is then transformed to generate an imaged pattern vibration amplitude information over a range of encoder working frequencies. Information of system vibrational performance is then derived from the encoder working frequency-based vibration amplitude information. As a result, the vibrational performance of the system is characterized to describe the system vibrational behavior in terms of imaged pattern vibration amplitudes at varying working frequencies of the encoder.

20 Claims, 21 Drawing Sheets

METHOD FOR CHARACTERIZING VIBRATIONAL PERFORMANCE OF CHARGED PARTICLE BEAM MICROSCOPE SYSTEM AND APPLICATION THEREOF

FIELD OF THE INVENTION

The present invention relates to a method of characterizing the vibrational performance of a charged particle beam microscope system and the application thereof.

BACKGROUND OF THE INVENTION

When scanning, a charged particle beam microscope system vibrates, causing the formed scan lines to jiggle. The jiggled scan line distorts or halos the obtained scan image, so the image becomes difficult to analyze i.e. the image quality is damaged. This greatly harms the performance and reliability of the charged particle microscope system.

There are various sources of vibration during a charged particle beam imaging operation, such as environmental noises and moving or rotating mechanical components in the microscope system.

Currently, the vibration issue is typically handled by fine-tuning the microscope system with reference to factory or field testing results of the system performed by the manufacturer or customer. This kind of work is basically experience-based, requiring a lot of trial-and-error thus is inefficient and costly both time-wise and manpower-wise. Moreover, the test result is hard to be reproduced on another machine or even for another imaging job on the same machine.

Therefore, it is desirable that the industry has a testing tool which can correctly describe the vibrational behavior of the mechanical sub-systems of the microscope system, which is one of the main contributors to the overall system vibration, and the testing effectiveness of the tool is preferably to be machine and/or imaging job independent.

SUMMARY OF THE INVENTION

The embodiments of the present invention disclose a method and applications thereof for characterizing the vibrational performance of a charged particle beam microscope system having at least one encoder.

One embodiment of the present invention discloses method for characterizing the vibrational performance of a charged particle beam microscope system which has at least one encoder. The method first provides a plurality of images taken by using the concerned charged particle beam microscope system, wherein the images comprise at least one imaged pattern and each of the images is taken at a predefined set of encoder frequencies. Next, the encoder frequencies are correlated with a vibration amplitude of the imaged pattern in the images.

The correlating step comprises: generating, for each image, a time-domain image vibration signal representing information of the imaged pattern vibration amplitude versus an elapsed time period of the concerned image being taken; generating, for each image, a frequency-domain image vibration spectrum from the time-domain image vibration signal, wherein the frequency-domain image vibration spectrum represents information of the imaged pattern vibration amplitude versus a range of frequencies including the set of encoder frequencies; identifying, for each image, from the frequency-domain image vibration spectrum, at least one encoder frequency from the set of encoder frequencies each with a corresponding imaged pattern vibration amplitude, so as to form at least one data pair accordingly; and forming, using the formed data pairs, points on a coordinate system of imaged pattern vibration amplitude versus frequency thereby forming a system vibrational performance chart.

The formed system vibrational performance chart characterizes the vibrational performance of the concerned charged particle beam microscope system, wherein the vibrational performance represents the imaged pattern vibration amplitude in individual image at at least one encoder frequency from the set of encoder frequencies at which the concerned image is correspondingly taken by using the charged particle beam microscope system.

Another embodiment of the present invention discloses a computing agent for characterizing the vibrational performance of a charged particle beam microscope system which has at least one encoder. The computing agent comprises: an input member, a computing member and an output member. The input member is able to be coupled to the concerned charged particle beam microscope system for receiving, from the charged particle beam microscope system, a plurality of images formed by the charged particle beam microscope system and information of a plurality of sets of encoder frequencies, wherein each image is formed at a corresponding set of encoder frequencies, and the images comprise at least one imaged pattern. The computing member is coupled with the input member for receiving the images and information of encoder frequencies from the input member.

The computing member executes the following steps: generating, for each received image, a time-domain image vibration signal representing information of a vibration amplitude of the imaged pattern versus an elapsed time period of the concerned image being formed; generating, for each received image, a frequency-domain image vibration spectrum from the time-domain image vibration signal, wherein the frequency-domain image vibration spectrum represents information of the imaged pattern vibration amplitude versus a range of frequencies including the set of encoder frequencies at which the image is correspondingly taken. The computing member then continues to execute steps of identifying, for each received image, from the frequency-domain image vibration spectrum, at least one encoder frequency from the set of encoder frequencies, each with a corresponding imaged pattern vibration amplitude, so as to form at least one data pair accordingly; and forming, using the formed data pairs, points on a coordinate system of imaged pattern vibration amplitude versus frequency thereby forming a system vibrational performance chart.

The formed system vibrational performance chart characterizes the vibrational performance of the concerned charged particle beam microscope system, wherein the vibrational performance represents the imaged pattern vibration amplitude in individual image at at least one encoder frequency from the set of encoder frequencies at which the concerned image is correspondingly taken by using the charged particle beam microscope system.

The output member is coupled with the computing member for receiving the system vibrational performance chart from the computing member and outputting the same for the user's interpretation.

Yet another embodiment of the present invention discloses a charged particle beam microscope system which has at least one encoder. The charged particle beam microscope system comprises: a moving stage whereupon a sample is secured for imaging; a charged particle beam generator for generating a primary charged particle beam; a condenser lens module for condensing the primary charged particle beam; a probe forming objective lens module for focusing the condensed primary charged particle beam into a charged particle beam probe; a deflection module for scanning the charged particle beam probe across a surface of the sample; a detector module for collecting charged particles generated from the sample surface upon bombardment of the charged particle beam probe and generating a detection signal accordingly; an image forming module coupled with the detector module for receiving the detection signal from the detector module and forming at least one charged particle microscopic images accordingly; and a vibration characterization module for characterizing the vibrational performance of the concerned charged particle beam microscope system by correlating the working frequencies of the encoder with corresponding vibration amplitudes of an imaged pattern in the images.

Accordingly, some of the embodiments of the present invention use an intrinsic element, the encoder, to assess the vibrational performance of a charged particle beam microscope system. A method and application thereof are proposed by the embodiments of the present invention.

DESCRIPTION OF THE EXEMPLARY EMBODIMENTS

One of the major vibration sources of a charged particle beam microscope system is the moving sample stage in a continuous scan mode operation. The stage is driven by a motor. Ideally, in the continuous scan mode the motor should be controlled to keep the stage at a predetermined constant speed. To achieve this, a closed-loop control scheme is typically adapted. An encoder is included in the control system for providing feedback to the controller indicating the instant stage moving speed. The signal-generating frequency of an encoder is generally referred to as the encoder frequency. When the encoder is functioning, the encoder frequency is known to be dependent upon the speed of the stage. In other words, one stage speed corresponds to one specific encoder frequency. This specific encoder frequency, which can be seen as an excitation frequency of the concerned microscope system, will be referred to as an encoder primary frequency hereinafter. For one primary frequency, a plurality of encoder harmonic frequencies may be derived mathematically due to non-linearity of the system.

The embodiments of the present invention propose a method to correlate the working encoder frequencies with the vibrational behavior of a charged particle beam microscope system at a certain stage speed, whereby characterizing the vibrational performance of the system. The proposed method can be implemented as a computing hardware, a firmware, or pure software (e.g. a computer readable medium encoded with a computer program). A charged particle beam microscope system configured to implement the proposed method is also disclosed.

Figure 1:
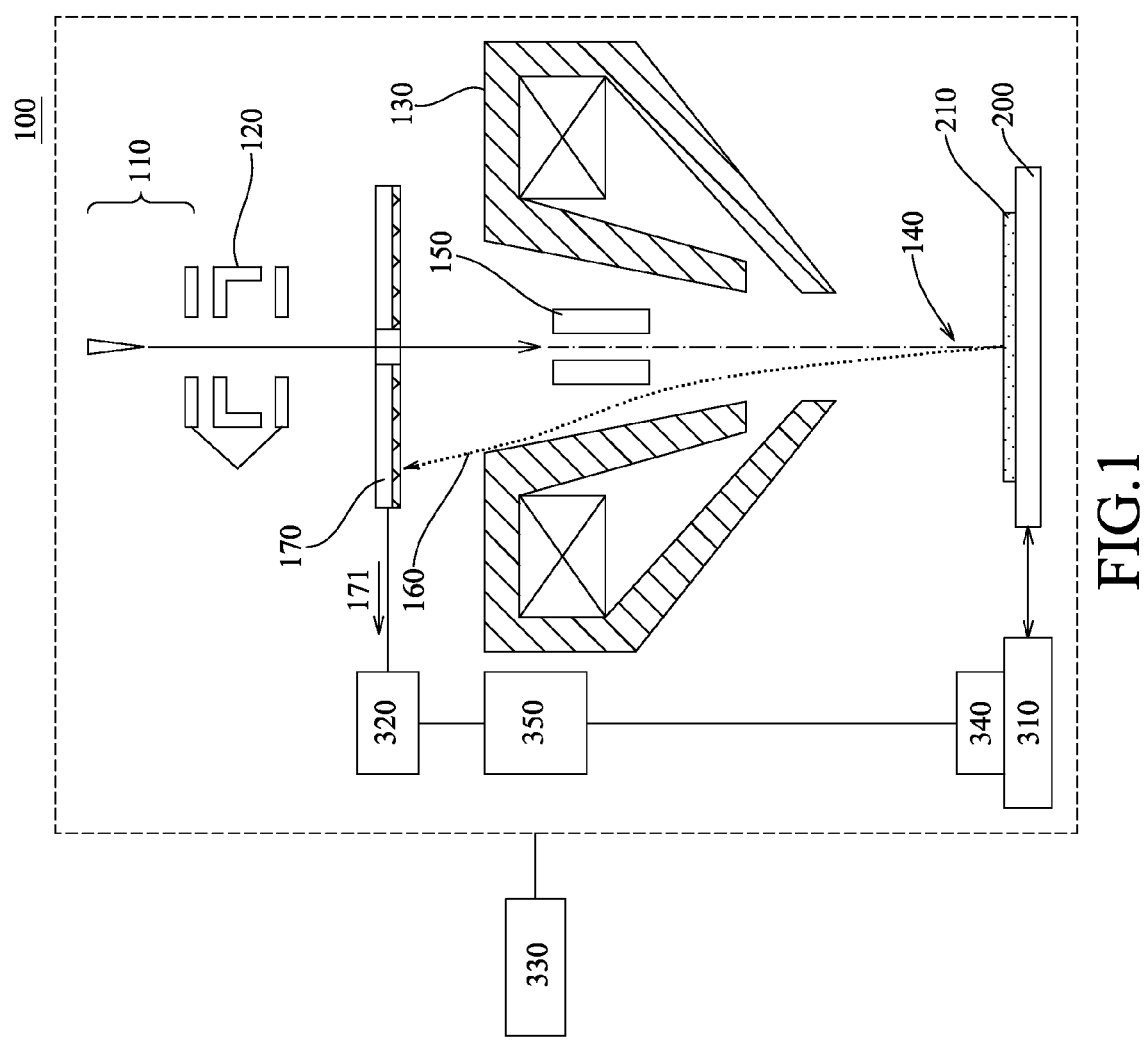
FIG. 1 is a schematic illustration of a charged particle beam microscope system according to an embodiment of the present invention.

FIG. 1 is a schematic illustration of a charged particle beam microscope system 100 according to an embodiment of the present invention. A charged particle beam generator 110 generates a charged particle beam, and then the charged particle beam is condensed and focused by a condenser lens module 120 and an objective lens module 130, respectively, to form a charged particle beam probe 140. The formed charged particle beam probe 140 then bombards the surface of a sample 210 secured on a stage 200. The charged particle beam probe 140 is controlled by a deflection module 150 to scan the surface of the sample 210 along a first direction to form a plurality of scan lines and, in the meanwhile, the stage 200 moves along a second direction at a certain speed. This second direction is designed to be at an angle to the first direction. In one embodiment, the second direction is selected to be substantially perpendicular to the first direction. In this embodiment, this kind of scanning operation is called a continuous scan mode operation. After the charged particle beam probe 140 bombards the surface of the sample 210, secondary charged particles 160 are induced to emit from the sample surface along with other charged particles of the beam probe 140 reflected by the sample 210. These particles are then detected and collected by a detector module 170. Then, the detector module 170 generates a detection signal 171 accordingly.

In this embodiment, the sample stage 200 is controlled by a closed-loop control system 310, which includes an encoder 340. The encoder 340 provides a feedback signal to a controller in the control system 310 indicating the instant position and moving speed of the sample stage 200. The encoder 340 also generates vibrations which contribute to the overall vibration of the microscope system 100. This encoder-generated vibration tends to be more significant at certain working frequencies of the encoder 340. These specific frequencies generally comprise the encoder primary frequency and its associate harmonic frequencies. An image forming module 320 coupled to the detector module 170 receives the detection signal 171 and accordingly forms a charged particle microscopic image of the sample 210. A vibration characterization module 330, which is coupled to the charged particle beam microscope system 100, for example to the image forming module 320 and the encoder 340, collects data of the obtained image from the image forming module 320 and information of the working encoder frequencies from the encoder 340 to accordingly generate a system vibrational performance chart for illustrating the vibrational performance of the concerned microscope system 100.

It is noted that as mentioned earlier, the encoder primary frequency is dependent upon the moving speed of the sample stage 200. It is also noted that the encoder harmonic frequencies are mathematically derived from the encoder primary frequency and are therefore also dependent upon the stage speed.

It is further noted that the speed of the stage 200 is determined by a desired imaging condition at which the image is to be taken. For example, the imaging condition may comprise parameters such as the desired pixel size, average number for a scan line/point pixel/frame image, the length of the scan lines, the sampling rate of the imaging channel of the charged particle beam microscope system, etc., or any combination thereof. In other words, the desired imaging condition gives rise to a corresponding moving speed of the stage 200. Therefore, when each image is taken at a different pre-selected imaging condition, each image is taken at a different stage speed. Further, in such case, as the encoder primary frequency (and thus the associate harmonic frequencies) is dependent on the stage speed, each image is taken at a different set of encoder frequencies corresponding to the stage speed at which the image is taken, and this frequency set is composed of one encoder primary and a plurality of harmonic frequencies derived thereof.

The charged particle beam microscope system 100 may also comprises a control module 350 for setting a speed for the stage 200 according to a desired imaging condition loaded into the charged particle beam microscope system 100 through, for example, a user input means (not shown in FIG. 1). Accordingly, the control module 350 should be at least coupled to such user input means and the stage 200. The control module 350 can be implemented as a pure hardware such as an independent IC, a firmware or a pure computing program. The way in which the control module 350 is implemented and the way it is coupled with the user input means and the stage 200 is known to those skilled in the art and will not be repeated herein.

Figure 2:
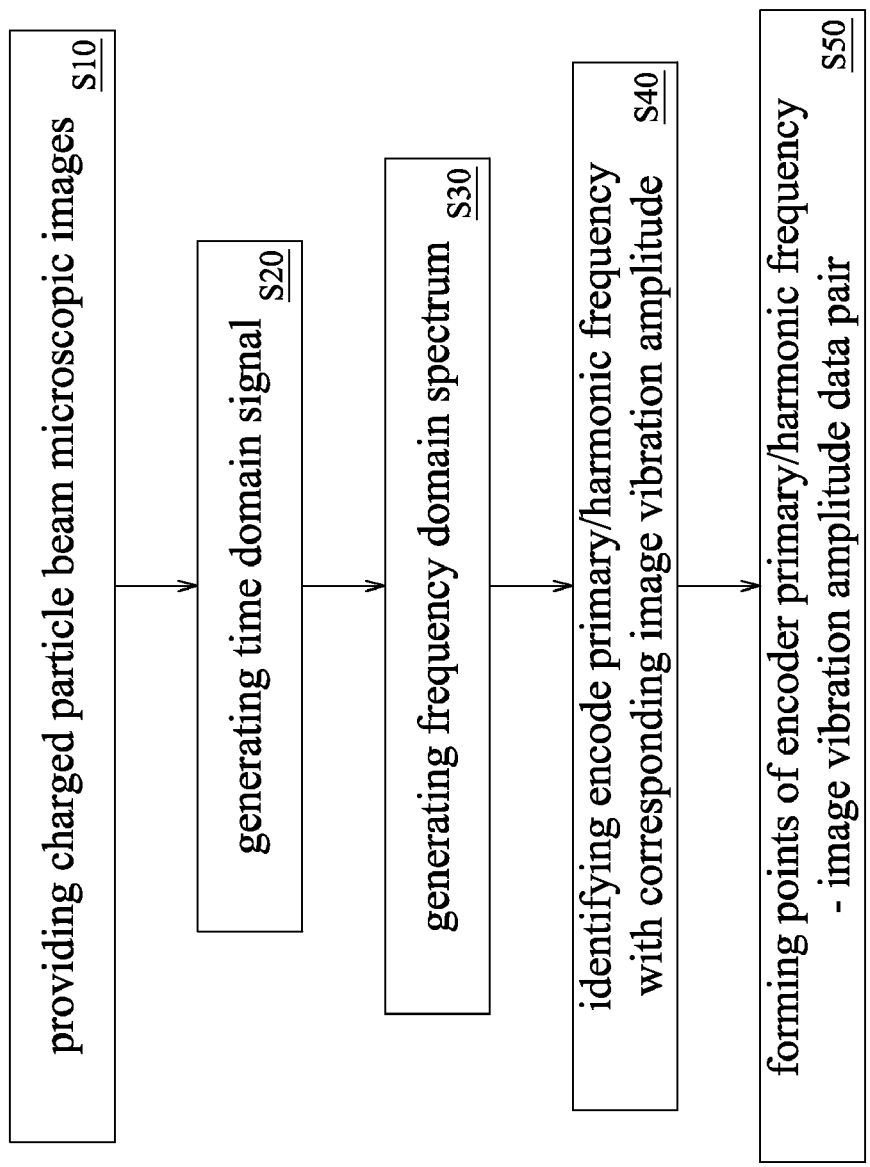
FIG. 2 is a flow chart illustration of a method for characterizing the vibrational performance of a charged particle beam microscope system according to an embodiment of the present invention.

In one embodiment of the present invention, a method is disclosed which can be executed by the vibration characterization module 330 to generate the aforementioned system vibrational performance chart from the obtained scan images. The method comprises steps of receiving a charged particle microscopic image, generating a time-domain image vibration signal from the received image, generating a frequency-domain image vibration spectrum from the time-domain image vibration signal, and identifying the imaged pattern vibration amplitude at an encoder primary and optionally harmonic frequencies from the frequency-domain image vibration spectrum. The encoder primary frequency and optionally harmonic frequencies along with their corresponding imaged pattern vibration amplitudes are then tabled and used to form respective points on a specific coordinate system. The process is repeated to form a plurality of such points thereby forming the system vibrational performance chart on the coordinate system. This chart describes the microscope system's vibrational performance in terms of the imaged pattern vibration amplitude at varying encoder frequencies. FIG. 2 shows a flow chart of the method.

It is noted that the sample 210 may be designed to have at least one stripe pattern thereon such that the obtained scan image contains at least one imaged stripe pattern. After the image is taken, an edge detection/extraction algorithm is applied to extract the edge of the imaged stripe pattern to form the time-domain image vibration signal. The edge extraction algorithm can catch all vibrations and noises showing on the imaged stripe pattern. If the image was taken in a vibration-free environment, the extracted stripe pattern edge would be a straight line. If however, there was vibration when the image was taken, the extracted stripe pattern edge would carry "waves".

In step S10 in FIG. 2, a plurality of charged particle microscopic images of a sample are provided. Each image is taken at a pre-selected imaging condition. Each image comprises at least one imaged stripe pattern therewithin. For each image, its imaging condition corresponds to a set of encoder frequencies comprising an encoder primary frequency and associate harmonic frequencies.

In step S20, a time-domain image vibration signal is generated for each of the provided charged particle microscopic images. As mentioned earlier, a vibration signal extractor for example an edge detection or extraction algorithm may be used to extract the edge of the imaged stripe pattern. The extracted edge can be treated as a signal along a time coordinate, wherein this signal carries all the vibration information of the concerned image, including the electrical and environmental noises captured during imaging. Data from the extracted edge are then used to form the time-domain image vibration signal. The formed time-domain image vibration signal shows a continuous curve composed of varying vibration amplitudes of the imaged pattern edge over an elapsed time period during which the sample was being imaged. The curve includes oscillations of various frequencies and amplitudes. For example, the curve in a time-domain image vibration signal may carry information of the encoder generated vibrations, vibration from other mechanical components in the microscope system, electrical noises, environmental noises such the human voice . . . etc.

In step S30 a frequency-domain image vibration spectrum is generated from each time-domain image vibration signal. A domain transformation operator, for example the Fast Fourier Transformation (FFT), is used to transform the time-domain image vibration signal to its corresponding frequency-domain image vibration spectrum. In such transformation, all vibration information carried by the time-domain signal including the encoder generated vibration, other system vibrations, environmental noises and so on, each with varying occurrence frequencies and amplitudes, are processed to produce a full-range spectrum. The frequency-domain image vibration spectrum represents the vibration amplitudes of the imaged pattern edge versus a range of frequencies including the set of encoder frequencies defined in S10.

In step S40, the encoder primary and optionally harmonic frequencies with corresponding imaged stripe pattern vibration amplitudes are identified from the frequency-domain image vibration spectrum. Recall that this encoder primary frequency is determined based on the stage speed which is determined by a pre-selected imaging condition at which the image was taken. Then, a data pair is formed accordingly which carries information of the identified encoder primary and optionally harmonic frequencies with their corresponding imaged pattern vibration amplitudes.

Next in step S50, the data pair from step S40 is used to form a point on a coordinate system of (imaged pattern) vibration amplitude versus frequency. The range of the frequency axis should at least include the set of encoder frequencies (i.e. thus the encoder primary and associate harmonic frequencies) at which the concerned image was formed. The above five steps are repeated to form a plurality of such points thereby finally producing a system vibrational performance chart. This chart illustrates the vibrational characteristics of the concerned charged particle beam microscope system with regard to the encoder primary (and optionally the harmonic) frequencies.

It is noted that in this embodiment, the vibrational characteristics of the concerned microscope system are expressed in the form of the vibration amplitude of the imaged stripe pattern versus the encoder primary and optionally harmonic frequencies. In other words, in the obtained system vibrational performance chart, a point with a higher value indicates a more severe vibration problem at the corresponding encoder primary/harmonic frequency. The stage speed and thus the imaging condition of an interested point in the chart can be found through checking the encoder primary and/or harmonic frequency of this point. Therefore, it can also be said that in the obtained system vibrational performance chart, a point with a higher value indicates a more severe vibration problem at the corresponding imaging condition of this point.

Figure 3:
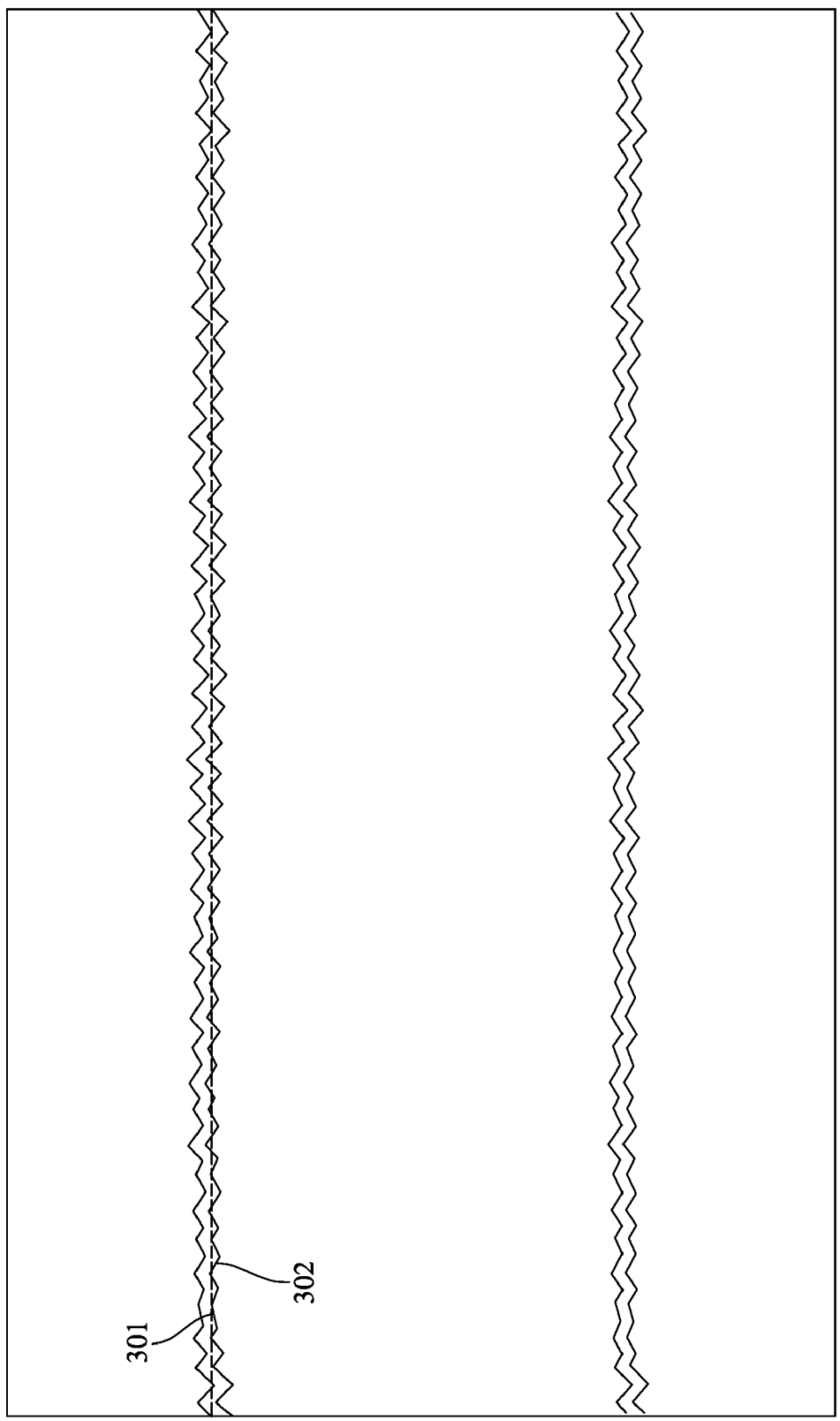
FIG. 3 is a schematic illustration of estimation of imaged pattern vibration amplitude according to an embodiment of the present invention.

The vibration amplitude of the imaged stripe pattern edge, or referred to as the imaged stripe pattern vibration amplitude or the imaged pattern vibration amplitude herein, can be quantified in various ways. In one embodiment of the present invention, it is estimated by measuring the degree of departure of the vibrating edge from a predefined reference. For example, as shown in FIG. 3, the reference can be an axis 301 passing through a center axis of the vibrating stripe pattern edge 302. This center axis may be obtained by averaging the relative height between individual points on the imaged stripe pattern or say the extracted edge.

It is noted that the consideration of the encoder harmonic frequencies can be optional. However, if the harmonic frequency-generated vibration components reach a noticeable level, they may also be shown in the system vibrational performance chart to give further information about the vibrational behavior of the concerned charged particle beam microscope system.

It is also noted that once the vibrational performance chart is generated, a threshold value can be defined for individual encoder primary/harmonic frequency to evaluate the vibrational behavior of the system at this frequency. For example, if the vibration amplitude of an imaged stripe pattern edge at a certain encoder primary/harmonic frequency exceeds a predefined threshold value, it is determined the vibrational performance of the concerned charged particle beam microscope system does not meet satisfaction at this encoder primary/harmonic frequency, otherwise it is determined the vibrational performance of the microscope system meets satisfaction at this frequency.

Figures 1, 4A:
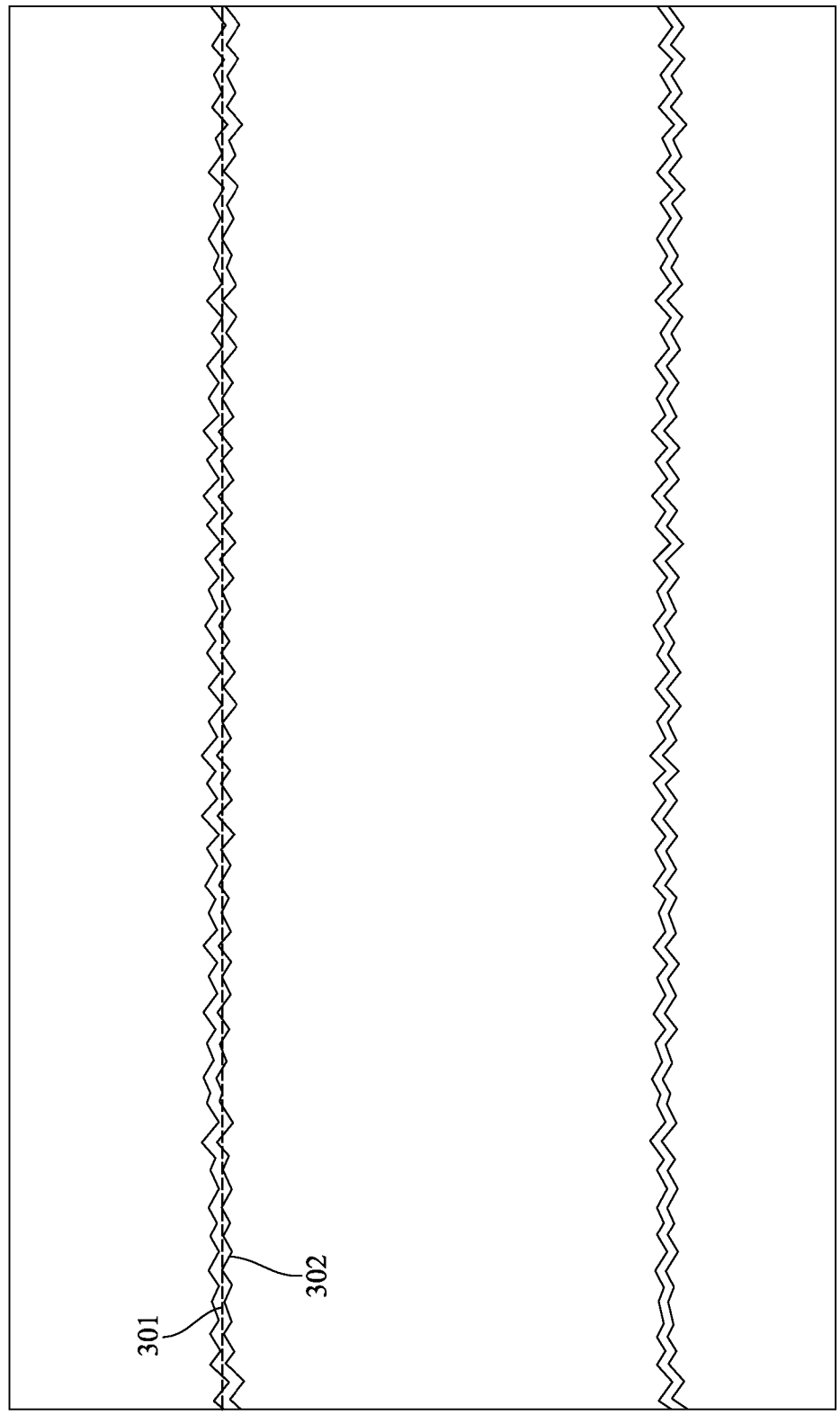
FIG. 4A~4F schematically illustrate the formation process of the system vibration performance chart in accordance with an embodiment of the present invention.
Figures 2, 4A:
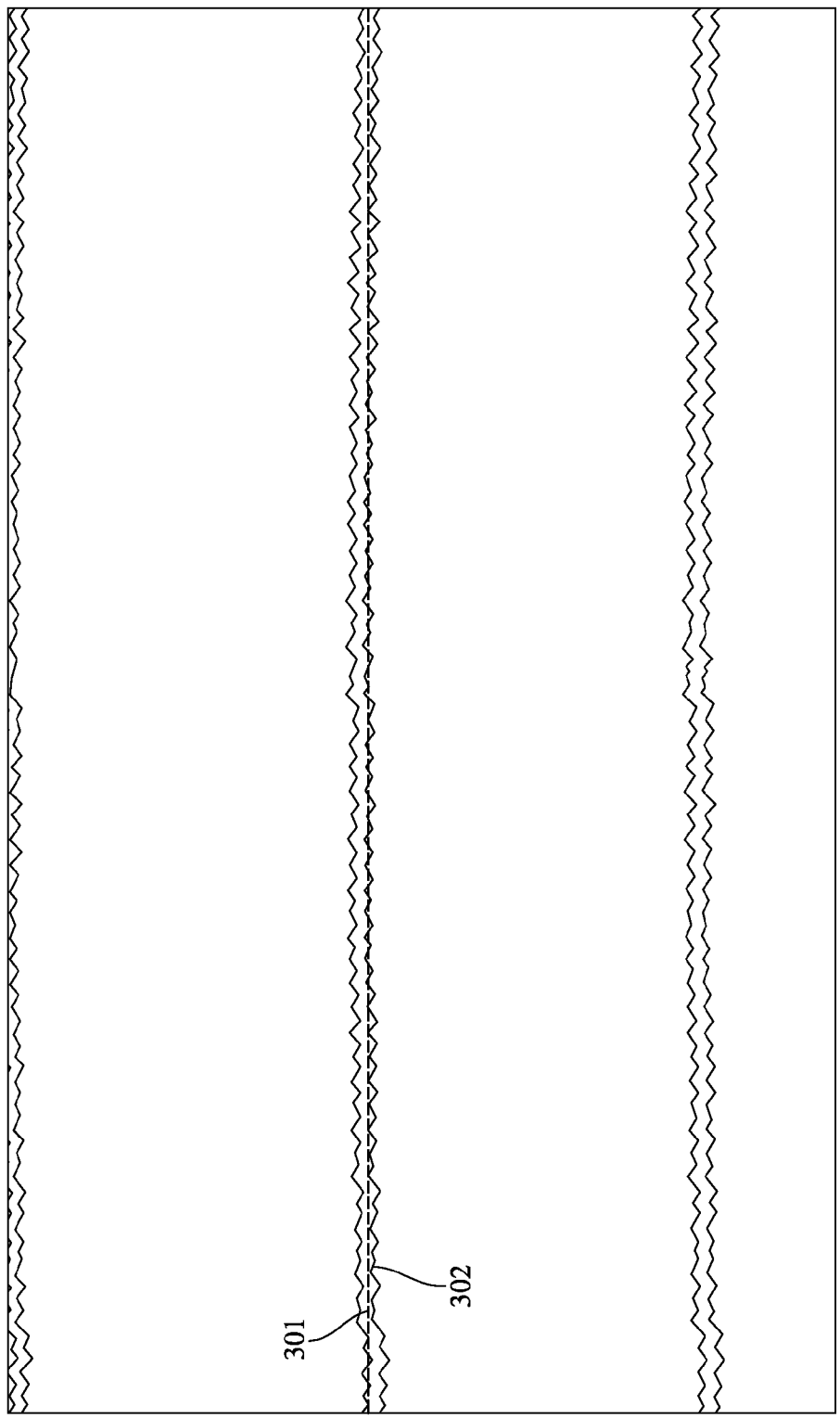
Figures 3, 4A:
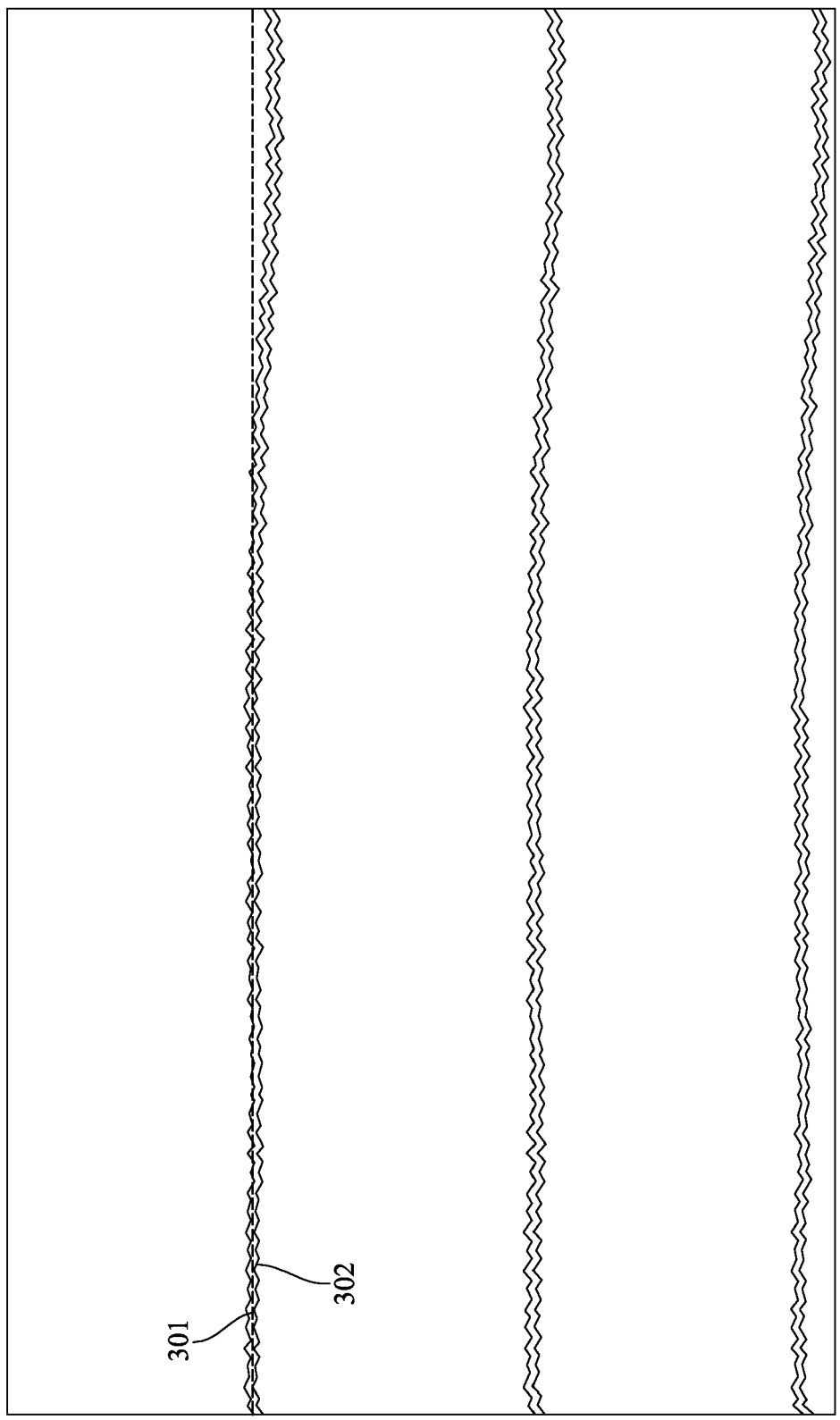
Figures 4, 4A:
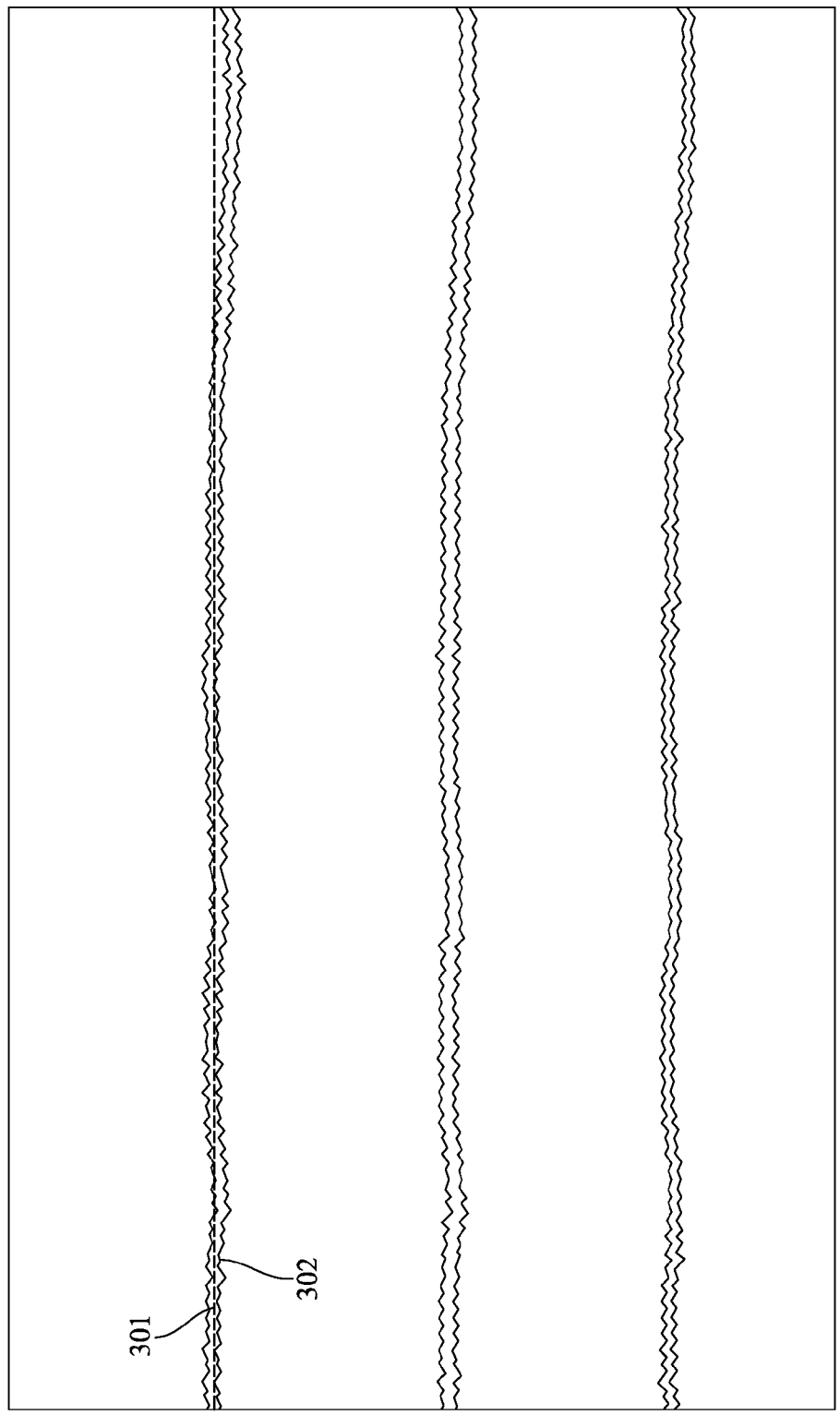
Figures 4, 4A, 5:
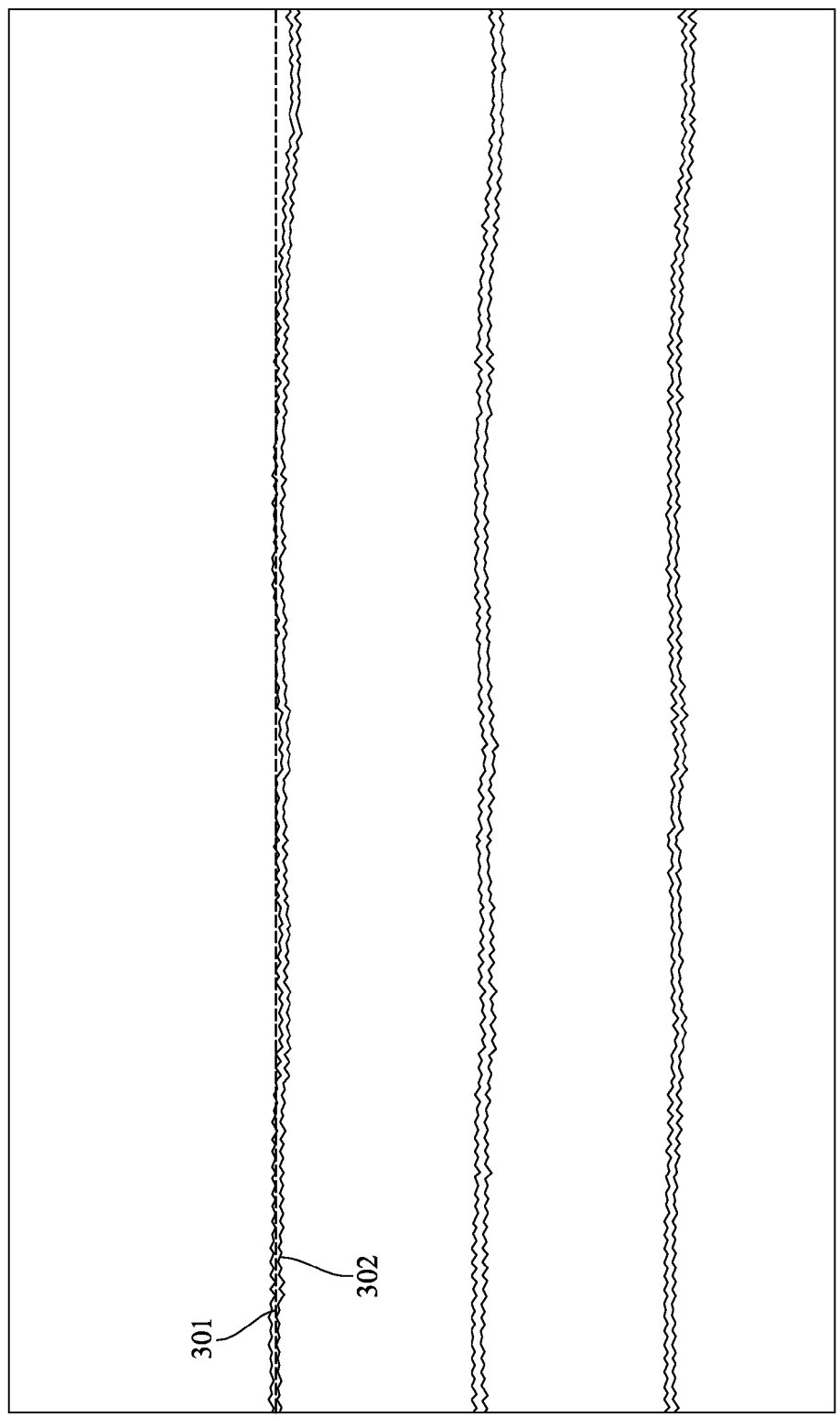

Reference will now be made to FIG. 4, which includes FIG. 4A-1~FIG. 4A-5, FIG. 4B-1~FIG. 4B-5, FIG. 4C-1~FIG. 4C-5, FIG. 4D, FIG. 4E and FIG. 4F to illustrate the formation process of the system vibrational performance chart in accordance with an embodiment of the present invention. It is noted that in this embodiment, the examined charged particle beam microscope system is selected to be a scanning electron beam microscope (SEM). First, five SEM images of a sample pattern 401, 402, 403, 404, 405 taken in a continuous scan mode are provided, as shown in FIG. 4A, which includes FIG. 4A-1, FIG. 4A-2, FIG. 4A-3, FIG. 4A-4 and FIG. 4A-5. Each of the images 401~405 is taken at a pre-selected imaging condition described in the title of the image. Consequently, each of the images 401~405 is taken at a specific stage speed, and thus at a specific encoder frequency set including a primary frequency and associate harmonic frequencies.

Figures 1, 4B:
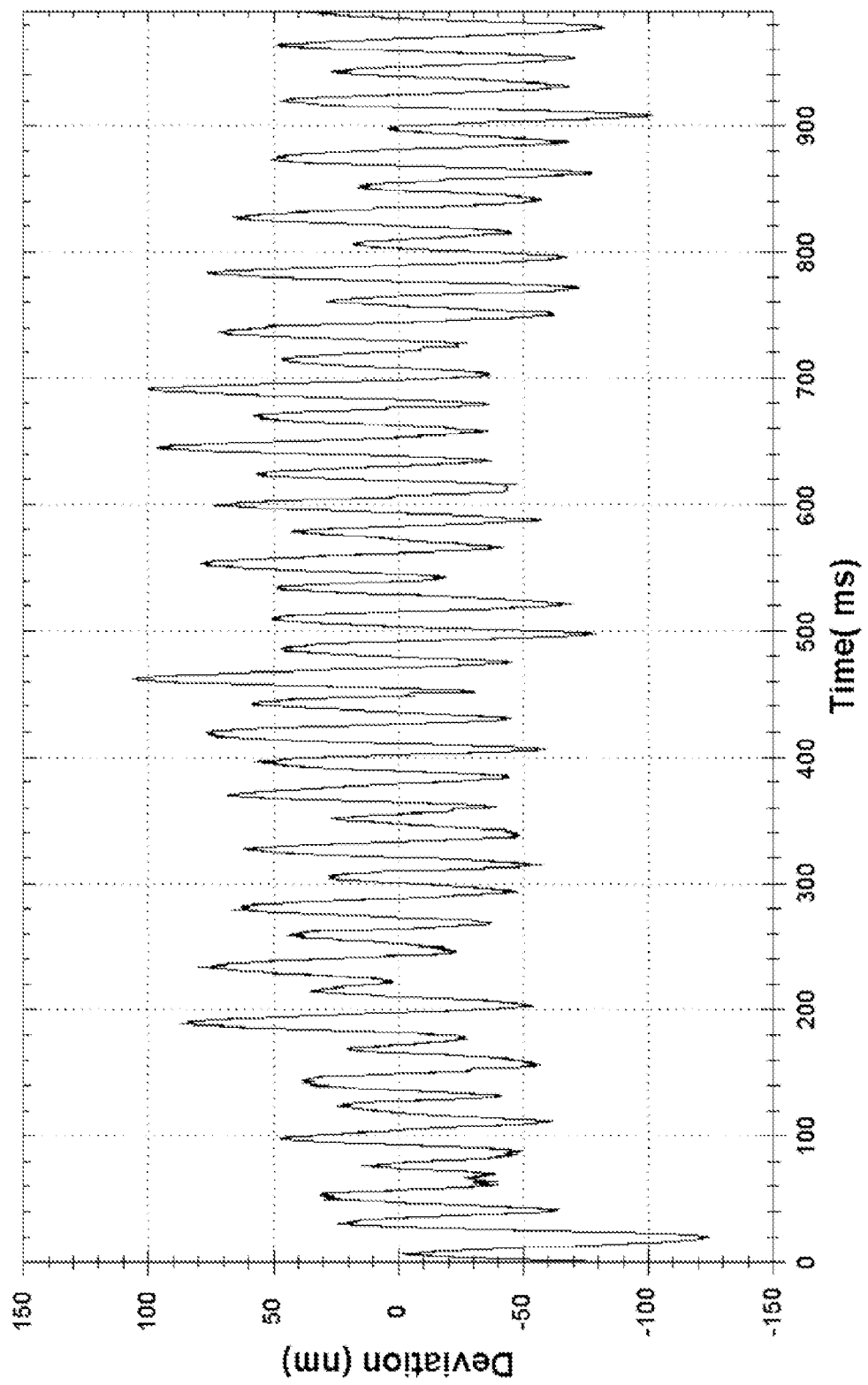
Figures 2, 4B:
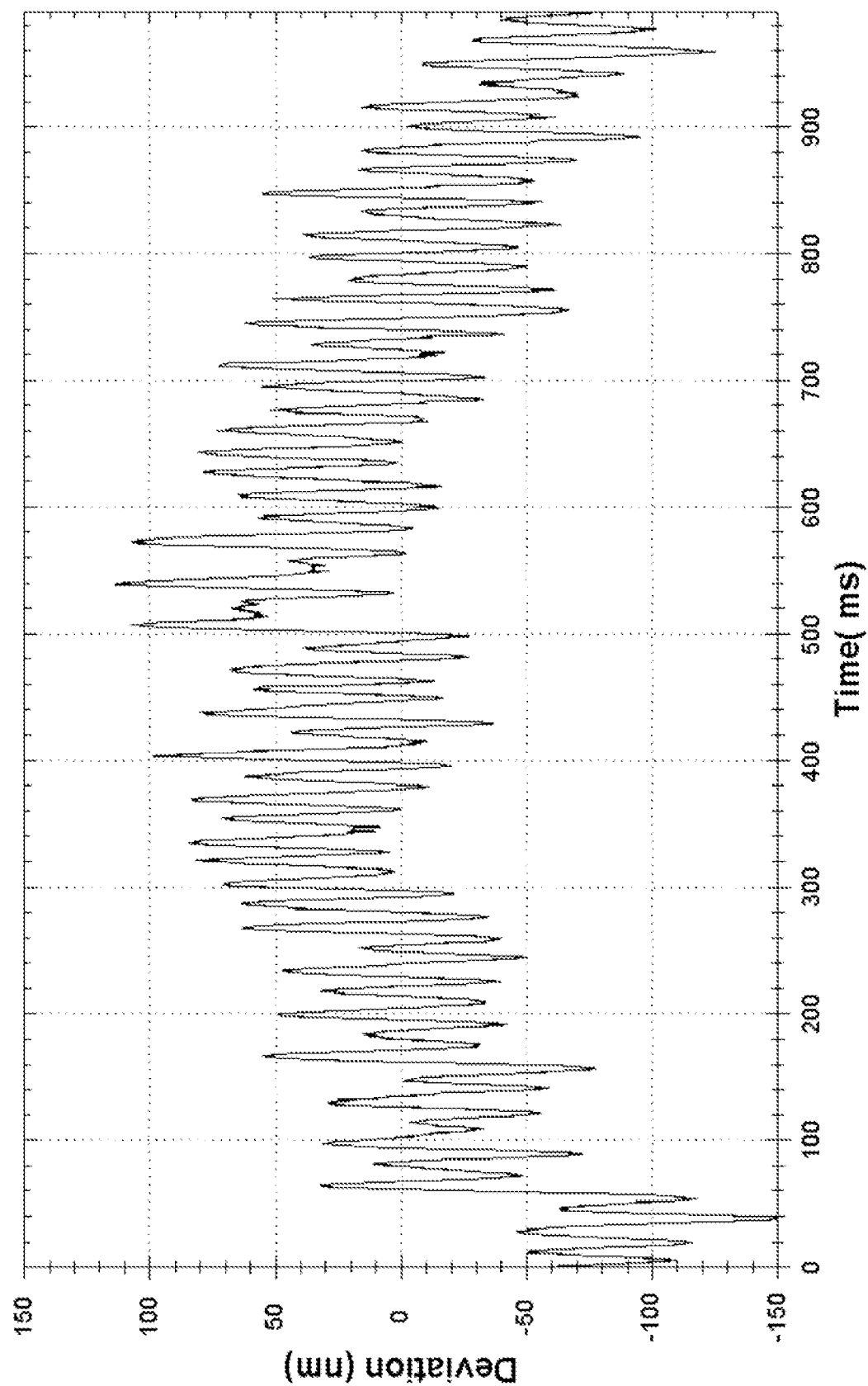
Figures 3, 4B:
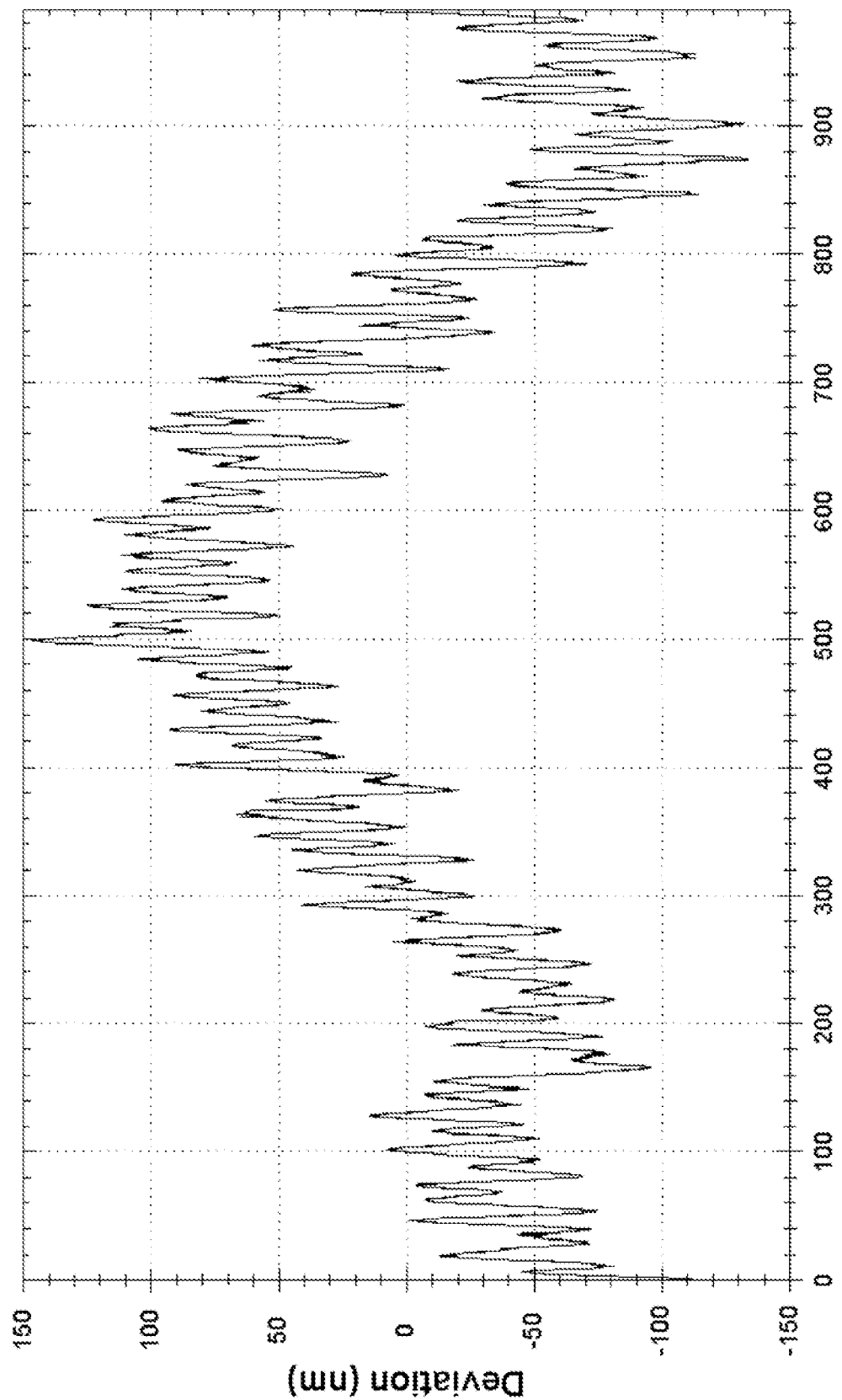
Figures 4, 4B:
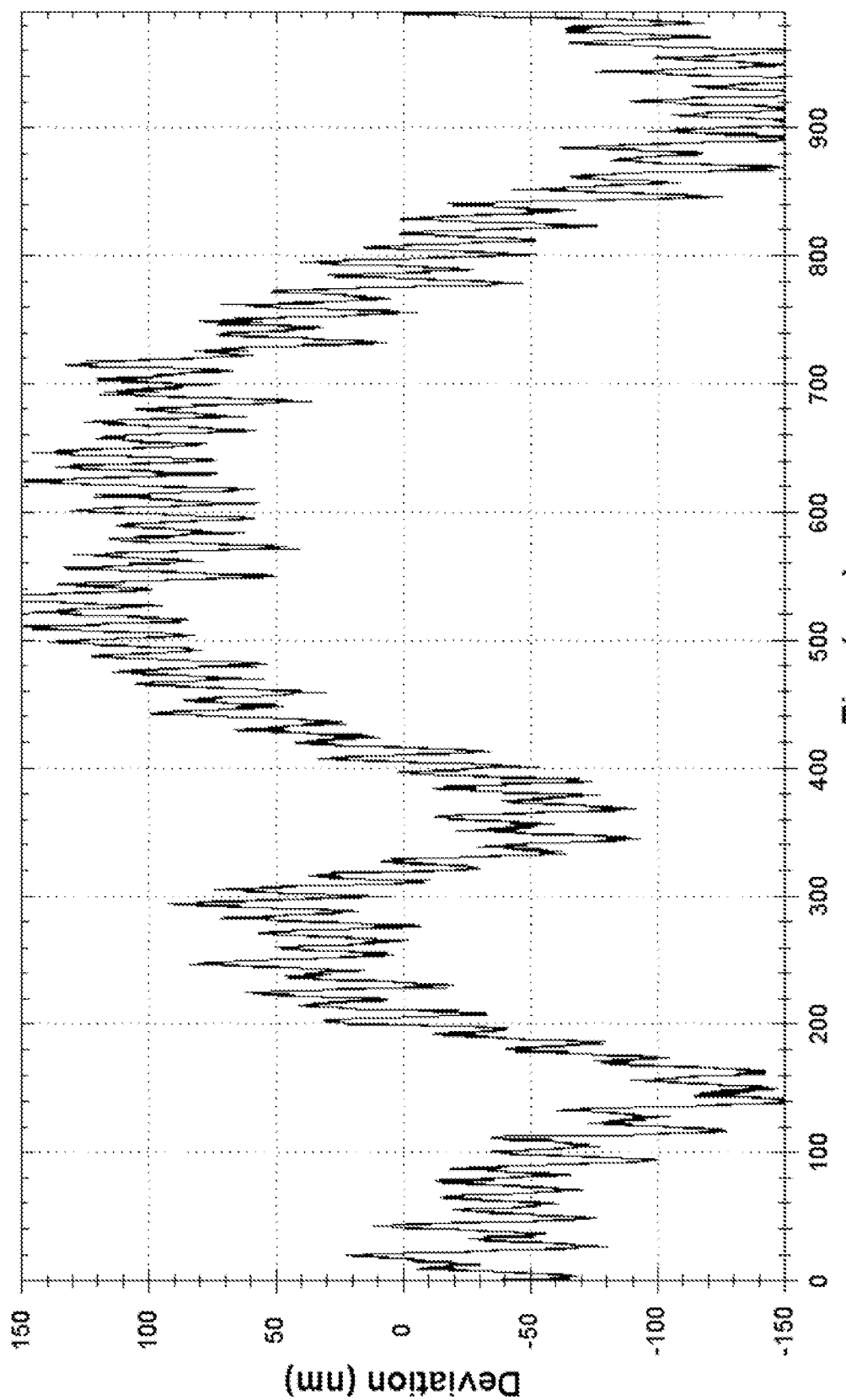
Figures 4, 4B, 5:
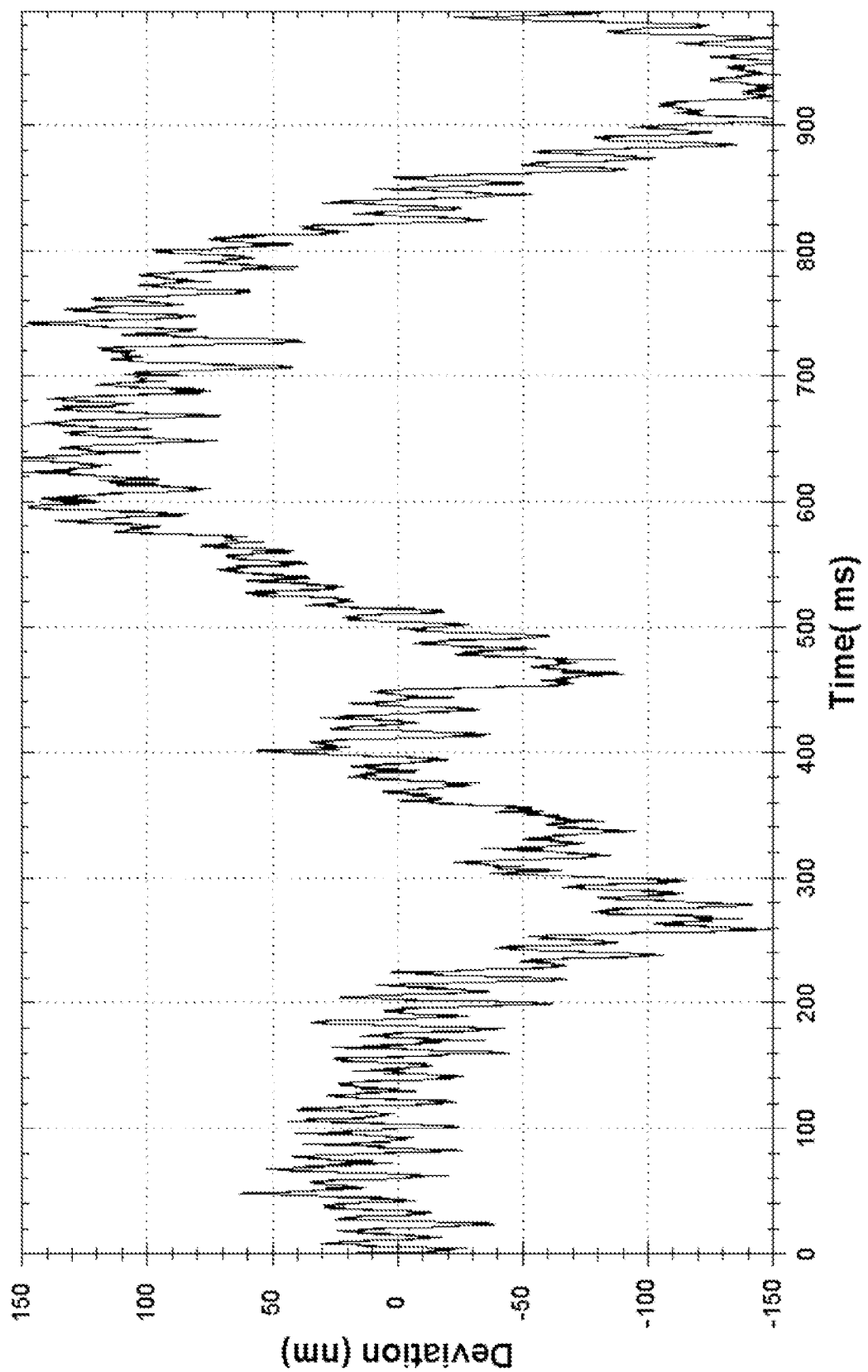
Figures 1, 4C:
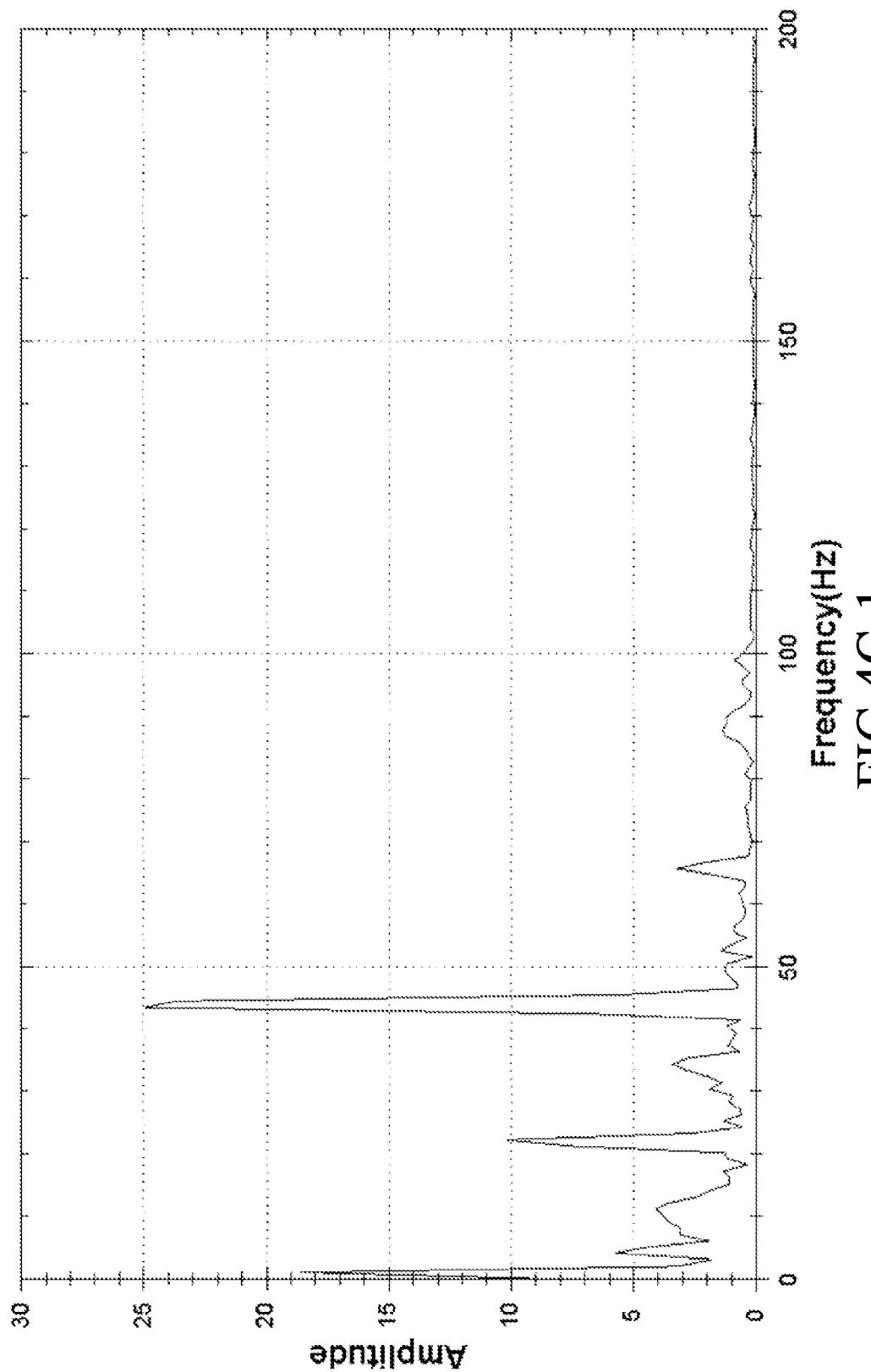
Figures 2, 4C:
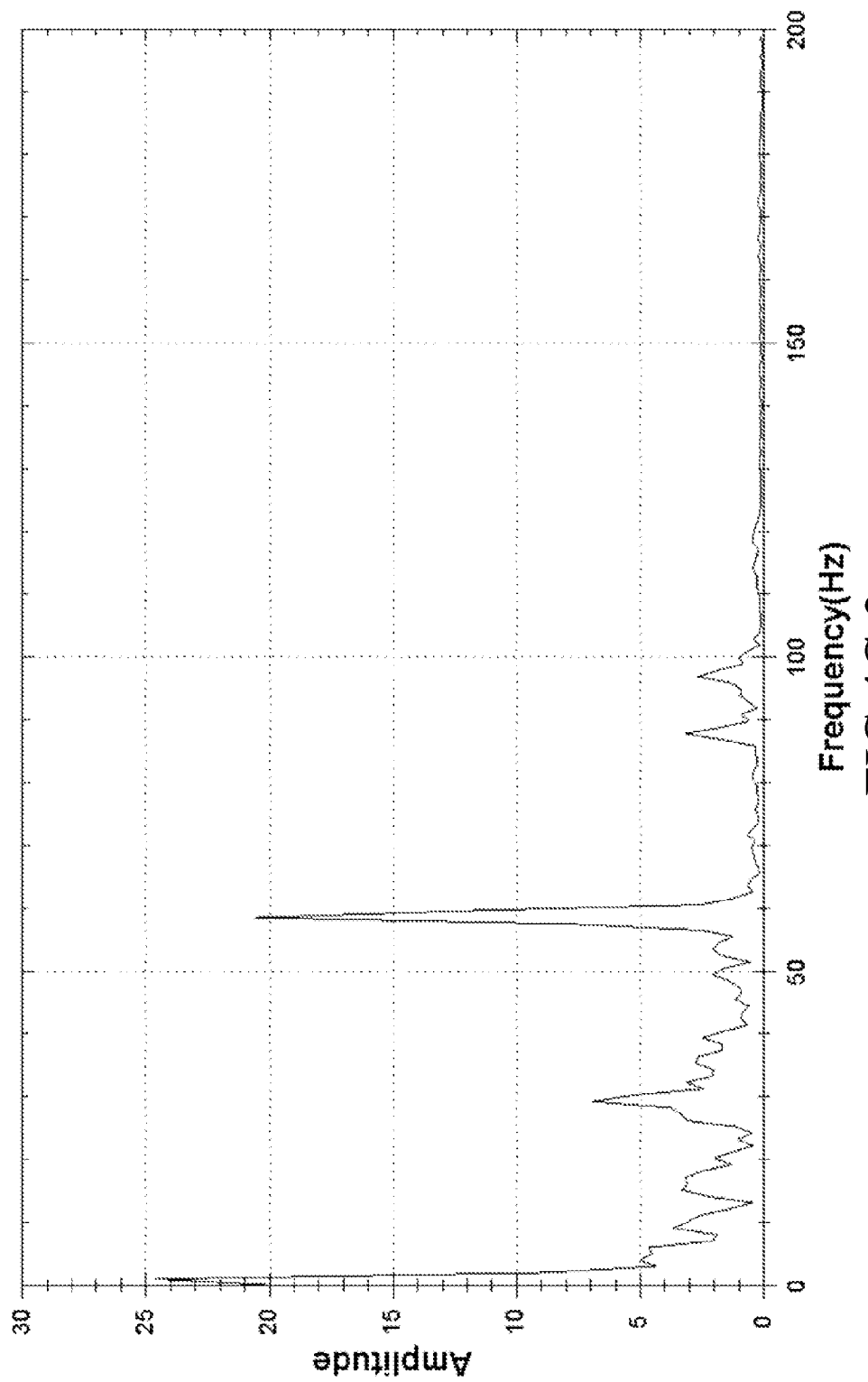
Figures 3, 4C:
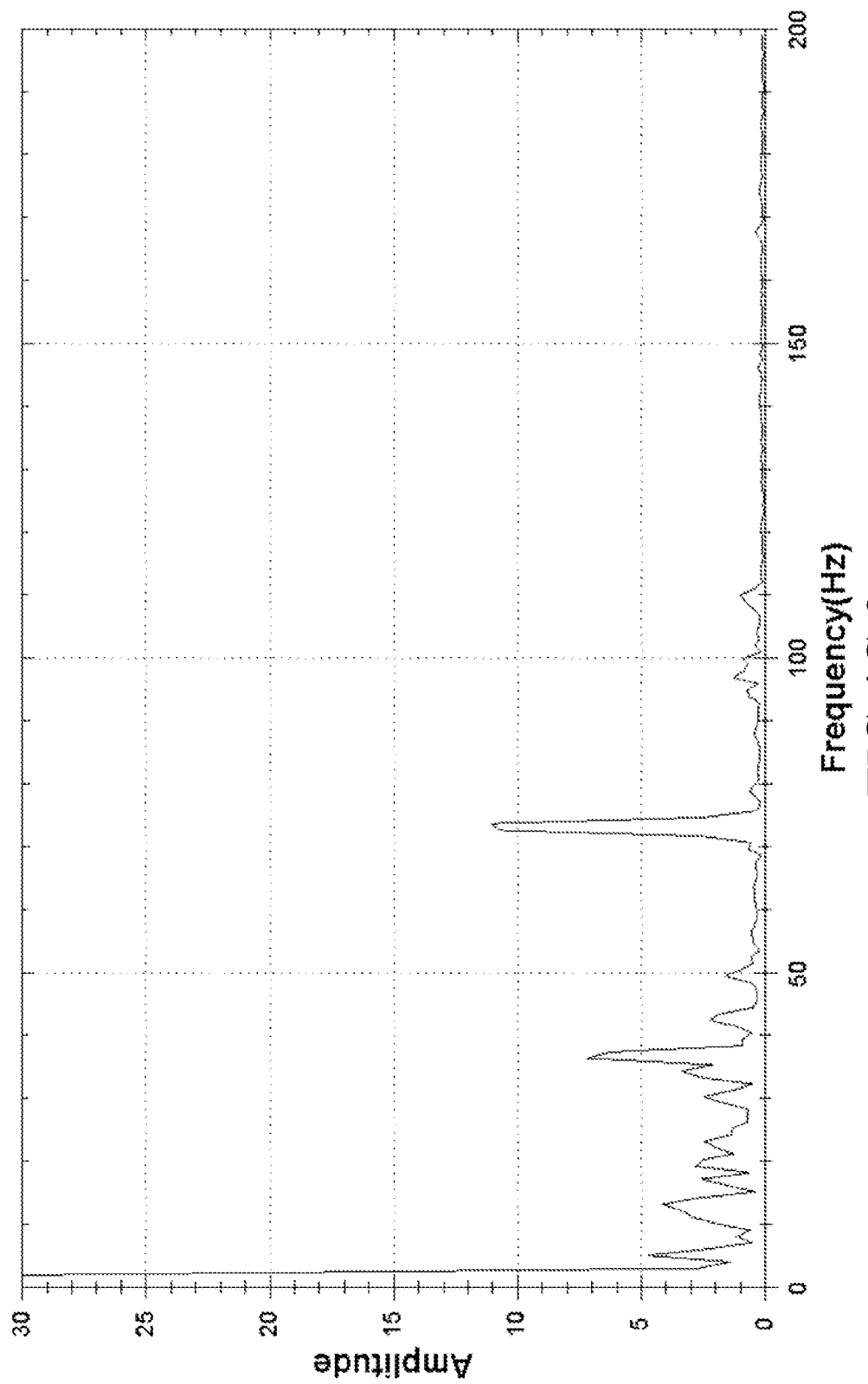
Figures 4, 4C:
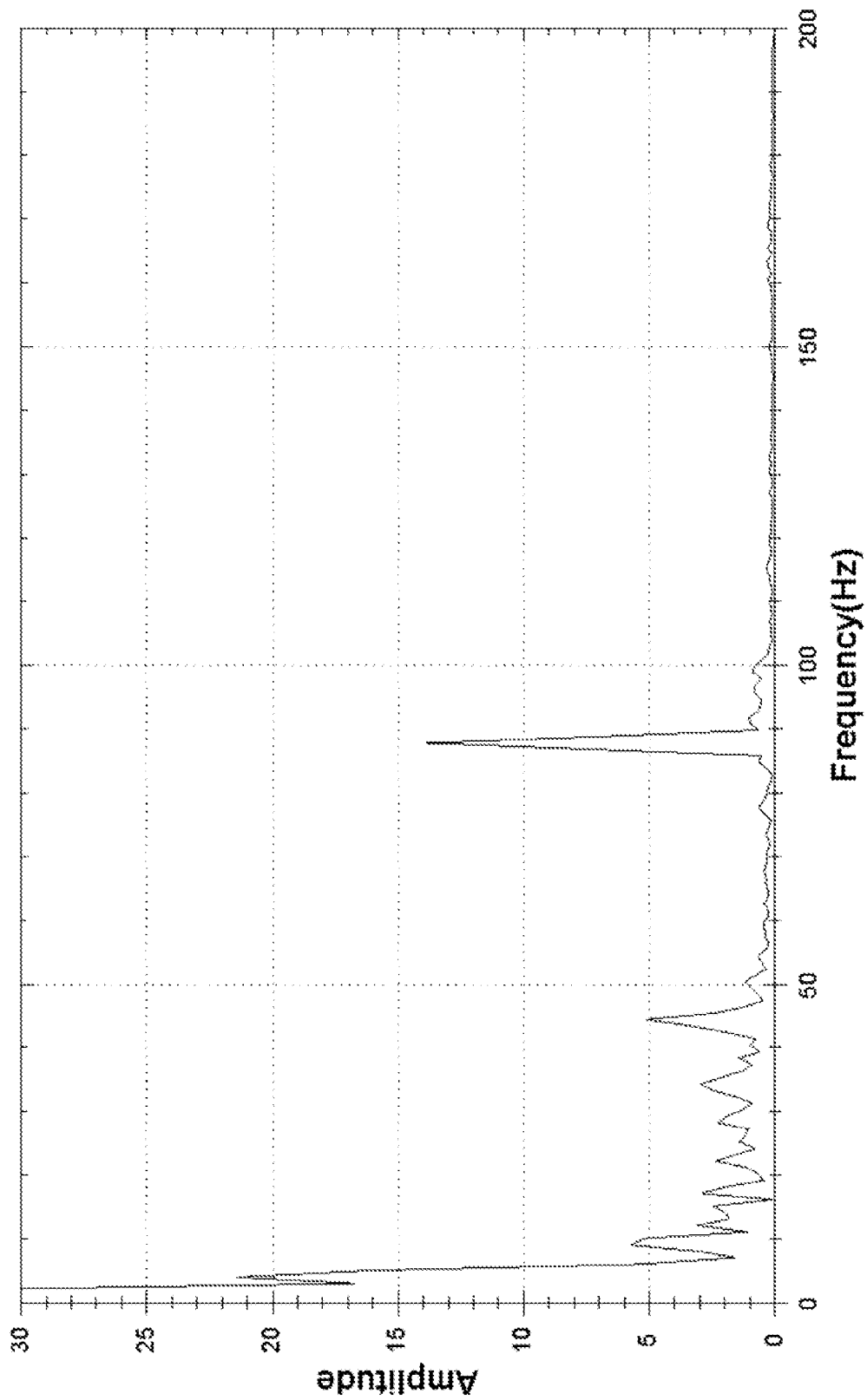
Figures 4, 4C, 5:
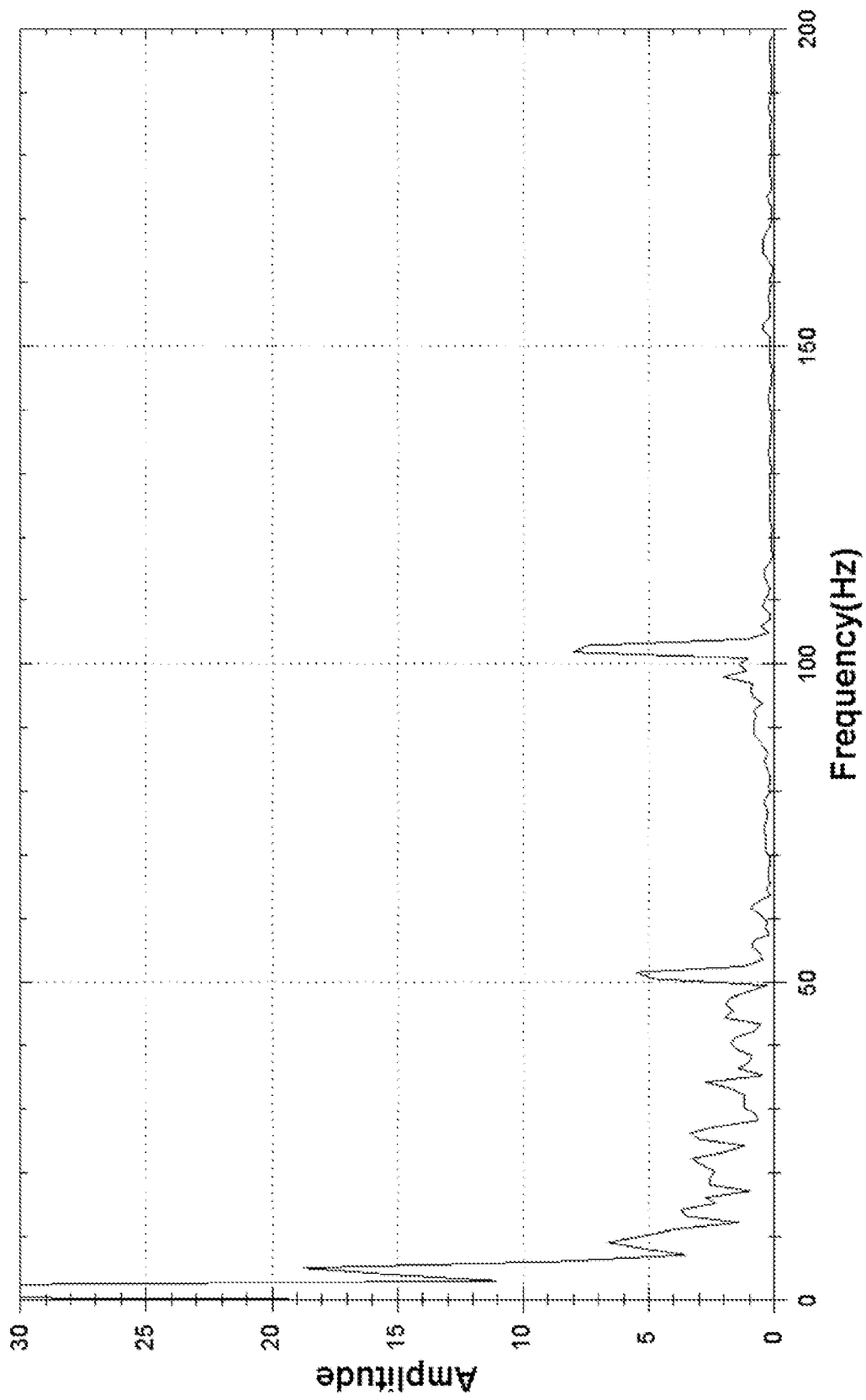
Figure 4D:
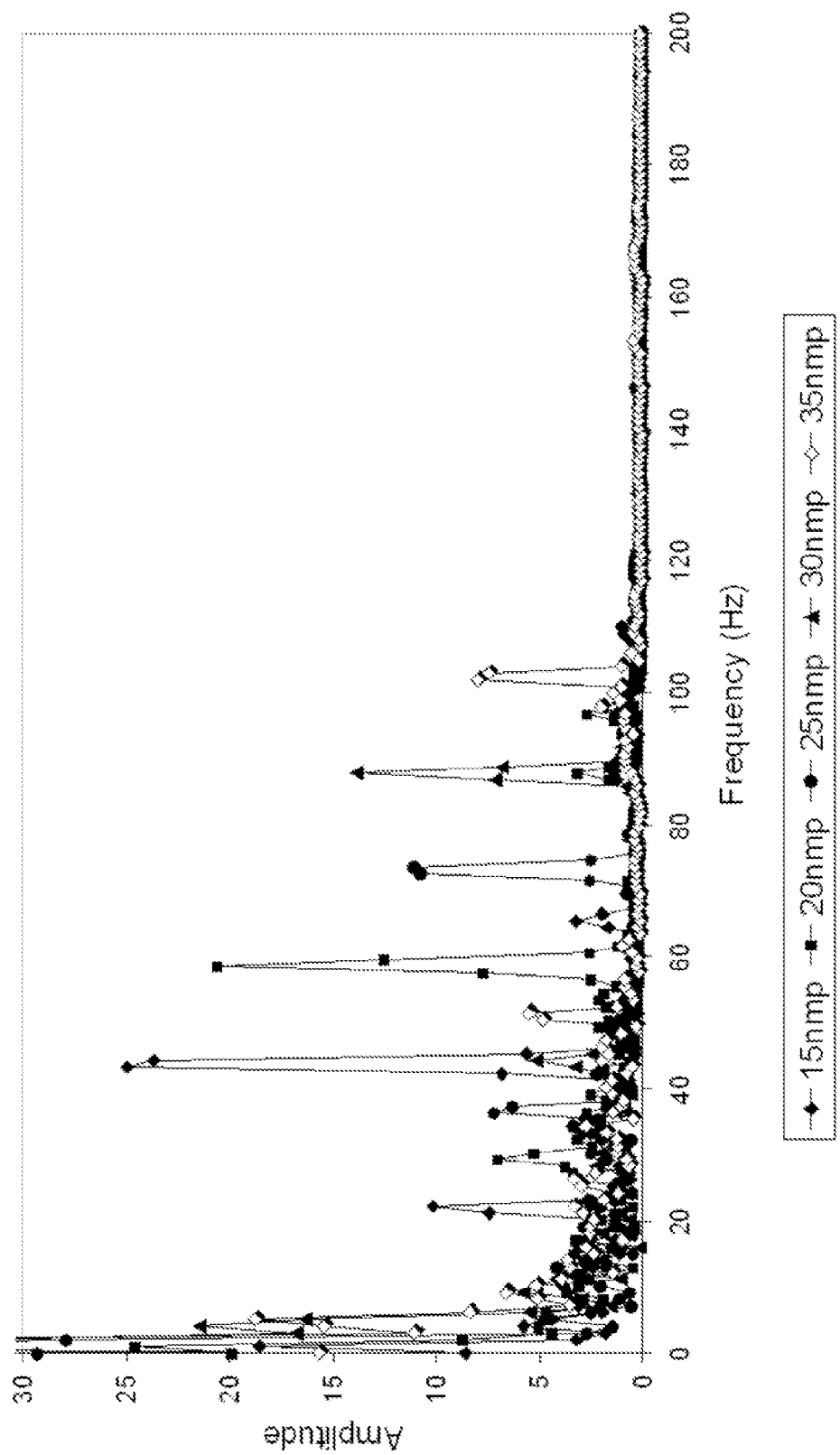
Figure 4E:
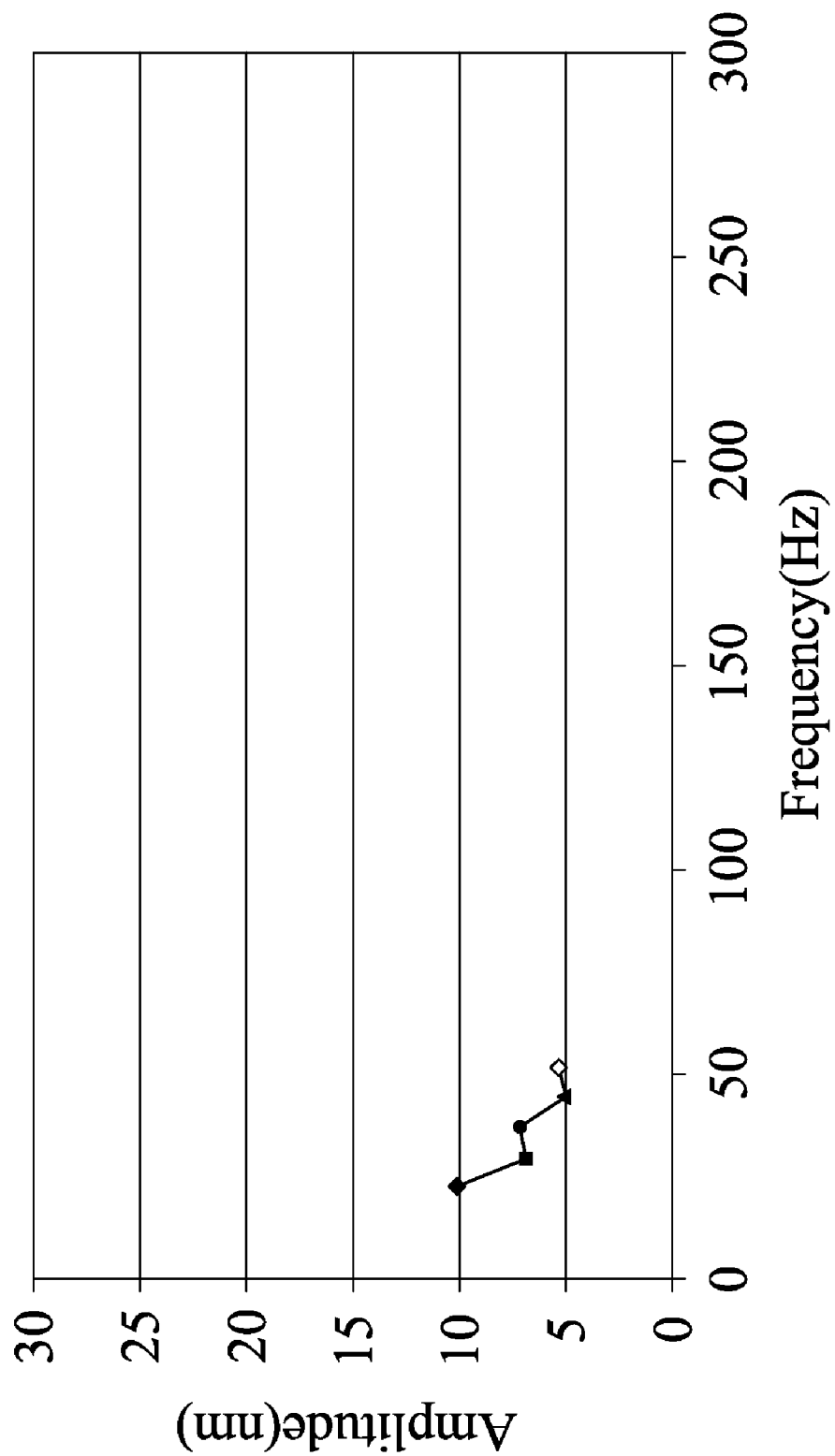

Referring to FIG. 4B, which includes FIG. 4B-1, FIG. 4B-2, FIG. 4B-3, FIG. 4B-4 and FIG. 4B-5, a time-domain image vibration signal is correspondingly generated for each of the images 401~405. As shown in FIG. 4B, these generated time-domain image vibration signals are denoted as 411, 412, 413, 414, 415, respectively. Next, individual time-domain image vibration signal 411~415 is transformed to a corresponding frequency-domain image vibration spectrum 421, 422, 423, 424, 425, as shown in FIG. 4C, which includes FIG. 4C-1, FIG. 4C-2, FIG. 4C-3, FIG. 4C-4 and FIG. 4C-5. FIG. 4D illustrates overlapped frequency-domain image vibration spectrums 421~425. Then, for each of the frequency-domain image vibration spectrums 421~425, an encoder primary frequency is identified from the horizontal axis and a corresponding imaged pattern vibration amplitude is identified from the vertical axis. This encoder primary frequency-imaged pattern vibration amplitude data pair is then tabled and used to generate a point on a coordinate system of (imaged pattern) vibration amplitude versus frequency. As five such points have been formed on the coordinate system, a system vibrational performance chart for the concerned SEM is completed, as shown in FIG. 4E. It is noted that this chart only illustrates the case of the encoder primary frequency.

In this embodiment, an analysis on the system vibrational behavior at the encoder harmonic frequencies also provides significant results. Detailed numbers of the encoder primary and one of the harmonic frequencies, the secondary frequency, for individual image and their corresponding imaged pattern vibration amplitude are given in Table 1. It can be seen from Table 1 that, at the encoder secondary frequency of the concerned SEM system, the imaged pattern vibration amplitude is at a noticeable level, with some even much greater than those at the primary frequencies. Therefore, for the concerned SEM system, a system vibrational performance chart at the encoder secondary frequency is necessary for a more informative tuning of the system. Such chart is illustrated in FIG. 4F.

Figure 4F:
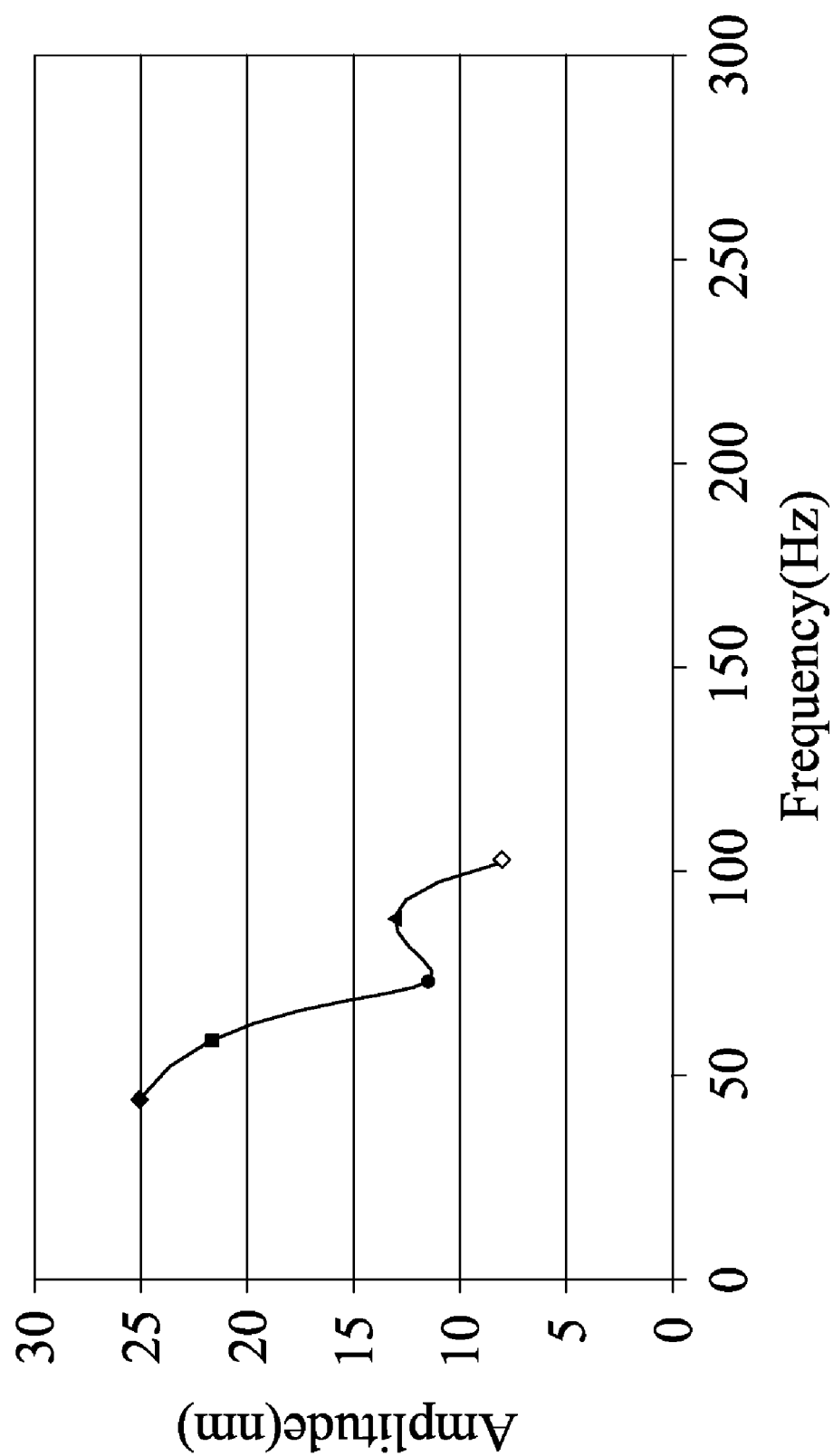

It can be seen from FIG. 4E and 4F that the system vibration performance is exceptionally unacceptable at working encoder frequencies in the vicinity of 50 Hz. Therefore, the corresponding imaging conditions at these frequencies need to be identified for rigorously testing and tuning the concerned SEM system so as to bring the curve down i.e. improve the system vibrational performance. In some cases, the hardware may be examined to find out if there is a loosened component that is generating severe vibration. After the system has been tuned, the system vibrational performance chart can be reproduced through the above process to see if the curve is lowered to an acceptable level. For example, if the imaged pattern vibration amplitude at a certain encoder primary or harmonic frequency exceeds a predefined threshold value, it is determined the system vibrational performance does not meet satisfaction at such frequency, otherwise it is determined the system vibrational performance meets satisfaction at such frequency.

It is noted that the proposed method described in conjunction with FIG. 2 to FIG. 4 can be implemented in the form of the vibration characterization module 330 described in conjunction with FIG. 1. The vibration characterization module 330 can be implemented as a pure hardware such as an independent IC, a firmware or a pure computing program. For example, it can be implemented as a computer readable medium encoded with a computer program, wherein the program is able to execute the details of the proposed method as described in those embodiments in conjunction with FIG. 2 to FIG. 4. In one embodiment, the vibration characterization module 330 may be implemented as one selected from a group consisting of the following: a mainframe host, a terminal computer, a personal computer, any kind of mobile computing devices, or any combination thereof.

In one embodiment, the vibration characterization module 330 is implemented as a computing agent which comprises at least an input member, a computing member and an output member. The input member can be coupled to the charged particle beam microscope system 100 for the vibration characterization module 330 to connect and access, for example, the image forming module 320 and the encoder 340. For example, the vibration characterization module 330 accesses these elements or their equivalents of the charged particle beam microscope system 100 to receive images formed by the charged particle beam microscope system 100 and information of working encoder frequencies during imaging, which comprises a plurality of sets of encoder frequencies (i.e. including a primary frequency and at least one associate harmonic frequencies), wherein each of the images is formed at a corresponding set of encoder frequencies. In one embodiment, the input member is coupled to the charged particle beam microscope system 100 through a medium selected from a group consisting of the following, or any combination thereof: cable wire, optical fiber cable, portable storage media, IR, Bluetooth, human manual input, intranet, internet, wireless network, wireless radio, etc. The computing member is coupled with the input member to receive, for example, the images and information of encoder frequencies from the input member for the use of carrying out the steps/actions described in conjunction with FIG. 2 to FIG. 4. In one embodiment, the vibration characterization module 330 may actively select a plurality of imaging conditions, each corresponding to a specific stage speed and thus a specific set of encoder frequencies (i.e. including a primary frequency and at least one associate harmonic frequencies), and instruct the charged particle beam microscope system 100 to perform imaging according to these selected imaging conditions to form corresponding images. The formed images are then fed back to the vibration characterization module 330 for analysis. In one embodiment, the selected imaging conditions may be inputted by a user through a user input means set on the vibration characterization module 330. Alternatively, the imaging conditions to be used can be picked out from those loaded into the charged particle beam microscope system 100, for example through a user input means set therewithin. Also, a mixture of imaging conditions from both the vibration characterization module 330 and the charged particle beam microscope system 100 may be used simultaneously. In one example, these imaging conditions for the purpose of characterization of a charged particle beam microscope system's vibrational performance may be pre-stored in a storage medium set in the vibration characterization module 330.

As described earlier, a system vibrational performance chart would be generated at the end of the operation of the computing member. The output member is coupled to the computing member to receive the generated system vibrational performance chart therefrom and then output it for the user's interpretation. For example, the outputs can be an electronic file recognizable by a computer, a screen display or printed hard copy reports.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

TABLE 1

| | Encoder primary frequency (Hz) | Image vibration amplitude (nm) | Encoder secondary frequency (Hz) | Image vibration amplitude (nm) |
|---|---|---|---|---|
| 15 nmp | 21.93 | 10.16 | 43.85 | 24.9 |
| 20 nmp | 29.93 | 6.96 | 58.47 | 21.5 |
| 25 nmp | 36.54 | 7.2 | 73.08 | 11.25 |
| 30 nmp | 43.85 | 5.15 | 87.7 | 12.77 |
| 35 nmp | 51.56 | 5.49 | 102.32 | 7.82 |

What is claimed is:

1. A method for characterizing the vibrational performance of a charged particle beam microscope system having at least one encoder, comprising:
   providing a plurality of images taken by using said charged particle beam microscope system, said images comprising at least one imaged pattern, each said image being taken at a predefined set of encoder frequencies; and
   correlating said encoder frequencies with a vibration amplitude of said imaged pattern in said images.

2. The method of claim 1, wherein said correlating step comprises:
   generating, for each said image, a time-domain image vibration signal representing information of said imaged pattern vibration amplitude versus an elapsed time period of concerned said image being taken;
   generating, for each said image, a frequency-domain image vibration spectrum from said time-domain image vibration signal, said frequency-domain image vibration spectrum representing information of said imaged pattern vibration amplitude versus a range of frequencies including said set of encoder frequencies;
   identifying, for each said image, from said frequency-domain image vibration spectrum, at least one said encoder frequency from said set of encoder frequencies each with a corresponding said imaged pattern vibration amplitude, so as to form at least one data pair accordingly; and
   forming, using said data pairs, points on a coordinate system of imaged pattern vibration amplitude versus frequency thereby forming a system vibrational performance chart characterizing said vibrational performance of said charged particle beam microscope system, wherein
   said vibrational performance represents said imaged pattern vibration amplitude in individual said image at at least one said encoder frequency from said set of encoder frequencies at which concerned said image is correspondingly taken by using said charged particle beam microscope system.

3. The method of claim 1, wherein provided said images are taken by using said charged particle beam microscope system in a continuous scan mode operation.

4. The method of claim 1, wherein each said set of encoder frequencies corresponds to a predefined imaging condition which comprises one selected from the group consisting of the following, or any combination thereof: pixel size, average number of scan of said sample in a point or line level, and the length of charged particle beam scan lines, a sampling rate of the imaging channel of the charged particle beam microscope system.

5. The method of claim 1, wherein each said set of encoder frequencies includes an encoder primary frequency and at least one encoder harmonic frequency derived from said encoder primary frequency.

6. The method of claim 1, wherein said encoder is part of a closed-loop control system controlling the motion of a moving stage whereupon a sample is secured for imaging, for providing a feedback signal indicating the instant moving speed of said stage.

7. A computing agent for characterizing the vibrational performance of a charged particle beam microscope system, said charged particle beam microscope system having at least one encoder, comprising:
   an input member able to be coupled to said charged particle beam microscope system for receiving, from said charged particle beam microscope system, a plurality of images formed by said charged particle beam microscope system and information of a plurality of sets of encoder frequencies, each said image being formed at a corresponding said set of encoder frequencies, said images comprising at least one imaged pattern;
   a computing member coupled with said input member for receiving said images and information of encoder frequencies from said input member, said computing member executing the following steps:
   generating, for each received said image, a time-domain image vibration signal representing information of a vibration amplitude of said imaged pattern versus an elapsed time period of concerned said image being formed;

generating, for each received said image, a frequency-domain image vibration spectrum from said time-domain image vibration signal, said frequency-domain image vibration spectrum representing information of said imaged pattern vibration amplitude versus a range of frequencies including said set of encoder frequencies;

identifying, for each received said image, from said frequency-domain image vibration spectrum, at least one said encoder frequency from said set of encoder frequencies each with a corresponding said imaged pattern vibration amplitude, so as to form at least one data pair accordingly; and forming, using said data pairs, points on a coordinate system of imaged pattern vibration amplitude versus frequency thereby forming a system vibrational performance chart characterizing said vibrational performance of said charged particle beam microscope system, wherein said vibrational performance represents said imaged pattern vibration amplitude in individual said image at least one said encoder frequency from said set of encoder frequencies at which concerned said image is formed by said charged particle beam microscope system; and an output member coupled with said computing member for receiving said system vibrational performance chart from said computing member and outputting the same for the user's interpretation.

8. The computing agent of claim 7, wherein said computing member further executes the following step:

selecting a plurality of imaging conditions, each said imaging condition corresponding to one of said sets of encoder frequencies;

causing, through said input member or an additional interface, said charged particle beam microscope system to form said images according to said selected imaging conditions.

9. The computing agent of claim 8, wherein said imaging conditions are obtained as a user input through a user input means on said computing agent, said charged particle beam microscope system, or both.

10. The computing agent of claim 9, wherein said imaging conditions are pre-stored in a storage medium in said computing agent.

11. The computing agent of claim 7, wherein said images are formed by said charged particle beam microscope system in a continuous scan mode operation.

12. The computing agent of claim 7, wherein said encoder is part of a closed-loop control system controlling the motion of a moving stage whereupon a sample is secured for imaging, for providing a feedback signal indicating the instant moving speed of said stage.

13. The computing agent of claim 7, wherein said input member is coupled to said charged particle beam microscope system through a medium selected from a group consisting of the following, or any combination thereof: cable wire, optical fiber cable, portable storage media, IR, Bluetooth, human manual input, intranet, internet, wireless network, wireless radio.

14. The computing agent of claim 7, wherein each said set of encoder frequencies includes an encoder primary frequency and at least one encoder harmonic frequency derived from said encoder primary frequency.

15. A charged particle beam microscope system having at least one encoder, comprising:

a moving stage whereupon a sample is secured for imaging;

a charged particle beam generator for generating a primary charged particle beam;

a condenser lens module for condensing said primary charged particle beam;

a probe forming objective lens module for focusing condensed said primary charged particle beam into a charged particle beam probe;

a deflection module for scanning said charged particle beam probe across a surface of said sample;

a detector module for collecting charged particles generated from said sample surface upon bombardment of said charged particle beam probe and generating a detection signal accordingly;

an image forming module coupled with said detector module for receiving said detection signal from said detector module and forming at least one charged particle microscopic images accordingly; and a vibration characterization module for characterizing the vibrational performance of said charged particle beam microscope system by correlating working frequencies of said encoder with corresponding vibration amplitudes of an imaged pattern in said images.

16. The charged particle beam microscope system of claim 15, wherein said vibration characterization module is coupled with said image forming module and said encoder, and is encoded with a computer program, said computer program caused said vibration characterization module to perform the following steps:

retrieving, from said image forming module, a plurality of images taken by using said charged particle beam microscope system, each said image comprising at least one imaged pattern;

receiving, from said encoder, a plurality sets of encoder frequencies from said encoder, each said image being taken at a predefined said set of encoder frequencies;

generating, for each said image, a time-domain image vibration signal representing information of said imaged pattern vibration amplitude versus an elapsed time period of concerned said image being taken;

generating, for each said image, a frequency-domain image vibration spectrum from said time-domain image vibration signal, said frequency-domain image vibration spectrum representing information of said imaged pattern vibration amplitude versus a range of frequencies including said set of encoder frequencies;

identifying, for each received said image, from said frequency-domain image vibration spectrum, at least one said encoder frequency from said set of encoder frequencies each with a corresponding said imaged pattern vibration amplitude, so as to form at least one data pair accordingly; and forming, using said data pairs, points on a coordinate system of imaged pattern vibration amplitude versus frequency thereby forming a system vibrational performance chart characterizing said vibrational performance of said charged particle beam microscope system, wherein said vibrational performance represents said imaged pattern vibration amplitude in individual said image at least one said encoder frequency from said set of encoder frequencies at which concerned said image is formed by said charged particle beam microscope system.

17. The charged particle beam microscope system of claim 15, wherein received said images are formed by said charged particle beam microscope system in a continuous scan mode operation.

18. The charged particle beam microscope system of claim 16, wherein each said set of encoder frequencies corresponds to a predefined imaging condition which comprises one selected from the group consisting of the following, or any combination thereof: pixel size, average number of scan of said sample in a point or line level, and the length of charged particle beam scan lines, a sampling rate of the imaging channel of the charged particle beam microscope system.

19. The charged particle beam microscope system of claim 18, further comprising a user input means for loading said imaging condition into said charged particle beam microscope system as a user input.

20. The charged particle beam microscope system of claim 15, wherein said encoder is part of a closed-loop control system controlling the motion of said stage, for providing a feedback signal indicating the instant moving speed of said stage.

* * * * *